(12) United States Patent
Ohsawa et al.

(10) Patent No.: US 9,318,170 B2
(45) Date of Patent: Apr. 19, 2016

(54) STORAGE DEVICE, MEMORY CELL, AND DATA WRITING METHOD

(71) Applicant: TOHOKU UNIVERSITY, Sendai-shi (JP)

(72) Inventors: Takashi Ohsawa, Sendai (JP); Tetsuo Endoh, Sendai (JP)

(73) Assignee: Tohoku University, Sendai-shi (JP)

( * ) Notice: Subject to any disclaimer, the term of this patent is extended or adjusted under 35 U.S.C. 154(b) by 0 days.

(21) Appl. No.: 14/758,100

(22) PCT Filed: Dec. 25, 2013

(86) PCT No.: PCT/JP2013/084750
§ 371 (c)(1),
(2) Date: Jun. 26, 2015

(87) PCT Pub. No.: WO2014/104131
PCT Pub. Date: Jul. 3, 2014

(65) Prior Publication Data
US 2015/0332745 A1    Nov. 19, 2015

(30) Foreign Application Priority Data
Dec. 28, 2012    (JP) .................. 2012-288567

(51) Int. Cl.
| *G11C 11/00* | (2006.01) |
| --- | --- |
| *G11C 7/22* | (2006.01) |
| *G11C 13/00* | (2006.01) |
| *G11C 11/16* | (2006.01) |
| *G11C 14/00* | (2006.01) |

(52) U.S. Cl.
CPC ............ *G11C 7/22* (2013.01); *G11C 11/1675* (2013.01); *G11C 13/0004* (2013.01); *G11C 13/0069* (2013.01); *G11C 14/009* (2013.01); *G11C 14/0081* (2013.01)

(58) Field of Classification Search
USPC .................................. 365/154, 145, 157, 163
See application file for complete search history.

(56) References Cited

U.S. PATENT DOCUMENTS

2012/0099360 A1*   4/2012   Takemura ............ G11C 11/412
                                                         365/72

FOREIGN PATENT DOCUMENTS

| JP | 2012-124703 | 6/2012 |
| --- | --- | --- |
| WO | WO 2004/040582 A1 | 5/2004 |
| WO | WO 2009/031231 A1 | 3/2009 |

OTHER PUBLICATIONS

Intl. Search Report issued in Intl. App. No. PCT/JP2013/084750, mailed Jan. 28, 2014.

(Continued)

*Primary Examiner* — Vu Le
(74) *Attorney, Agent, or Firm* — Greer Burns & Crain Ltd.

(57) ABSTRACT

A memory cell (1) includes a first storage circuit (2) with a write time $t_1$ and a data retention time $\tau_1$ and a second storage circuit (3) with a write time $t_2$ and a data retention time $\tau_2$ ($t_1 < t_2$ and $\tau_1 < \tau_2$). A row decoder supplies write data to the memory cell (1) via a word line (WL) to write the data on the first storage circuit (2) over a write time $t_W$ that is longer than the write time $t_1$ and that is shorter than the write time $t_2$. A PL control circuit (4) supplies power to the memory cell (1) for a time that is longer than the write time $t_2$ when the write data is supplied to the memory cell (1), writes, on the second storage circuit (3), the data written on the first storage circuit (2) once the supply of the write data is stopped, and stops the supply of the power to the memory cell (1) after a lapse of the write time $t_2$ following start of the supply of the write data.

15 Claims, 31 Drawing Sheets

(56) References Cited

OTHER PUBLICATIONS

Yamamoto et al.; " Nonvolatile Static Random Access Memory Using Magnetic Tunnel Junctions with Current-Induced Magnetization Switching Architecture"; Japanese Journal of Applied Physics 48, pp. 043001-1 to 043001-7; 2009; The Japan Society of Applied Physics.

Ohsawa et al.; "1Mb 4T-2MTJ Nonvolatile STT-RAM for Embedded Memories Using 32b Fine-Grained Power Gating Technique with 1.0ns/200ps Wake-up/Power-off Times"; 2012 Symposium on VLSI Circuits Digest of Technical Papers; pp. 46-47; Jun. 2012.

Chang et al.; "Stable SRAM cell Design for the 32 nm Node and Beyond"; 2005 Symposium on VLSI Technology Digest of Technical Papers; pp. 128-129, Jun. 2005.

Hosomi et al.; "A Novel Nonvolatile Memory with Spin Torque Transfer Magnetization Switching: Spin-RAM"; IEDM Tech. Digest, p. 459; 2005.

\* cited by examiner

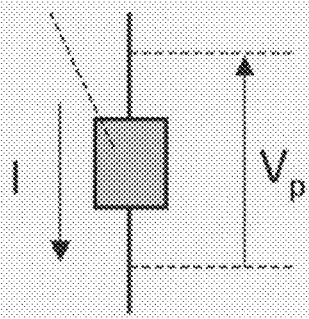
FIG.10A STORAGE ELEMENT
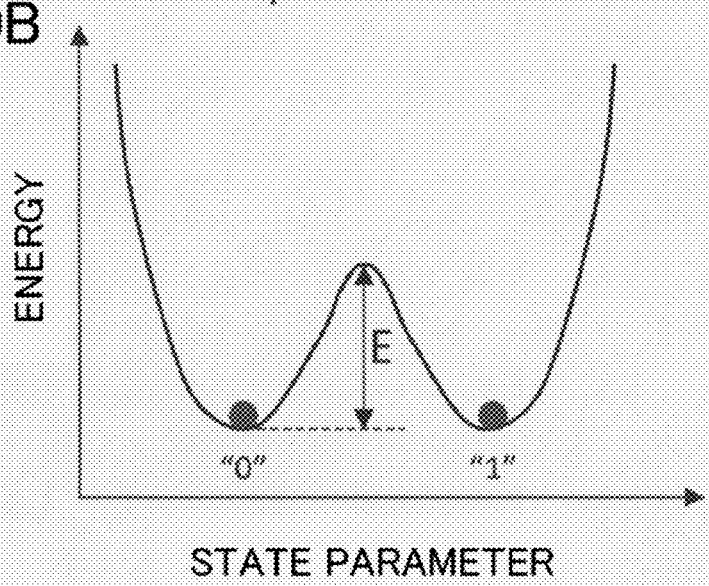
FIG.10B
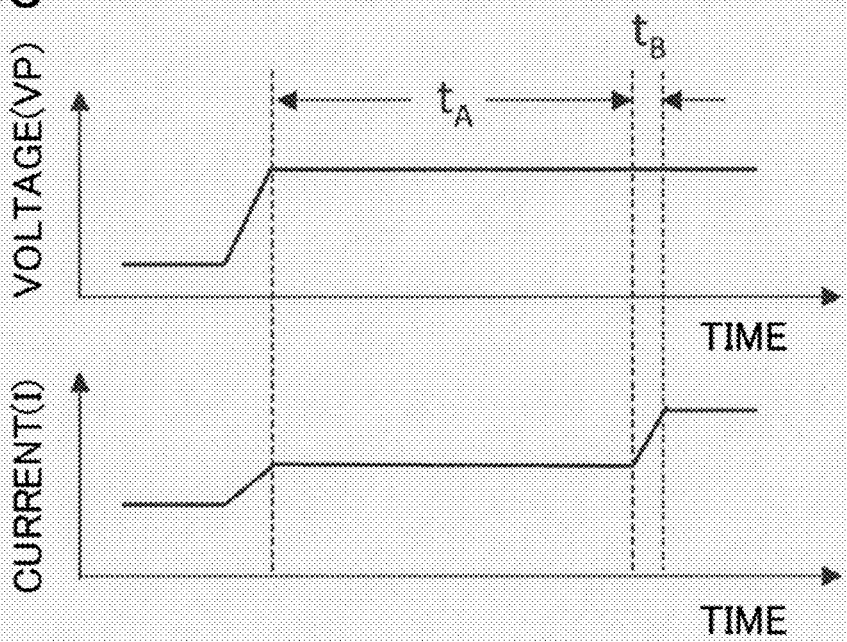
FIG.10C

STORAGE DEVICE, MEMORY CELL, AND DATA WRITING METHOD

This is a National Phase Application filed under 35U.S.C. §371, of International Application No. PCT/JP2013/084750, filed Dec. 25, 2013.

TECHNICAL FIELD

The present disclosure relates to storage devices, memory cells, and data writing methods. More specifically, the present disclosure relates to a storage device in which a resistance-change-type storage element is used, a memory cell, and a data writing method.

BACKGROUND ART

There is a problem that as integrated circuits becomes finer (scaling) and the integrated circuits have a higher capacity, the off-state leakage current of a transistor such as a MOSFET which is a basic element of the integrated circuits, e.g. SRAM (FIG. 27), increases, resulting in increased power consumption therein.

Therefore, an attempt to power off an integrated circuit has been made to reduce an off-leak when information processing is not carried out in the integrated circuit. For example, there is a method in which data stored in a volatile storage circuit and/or the like included in an integrated circuit is saved into a storage element with a long data retention time prior to power off, and the data saved into the storage element with a long data retention time is restored in the volatile storage circuit and/or the like after power on to return a circuit state to a state prior to the power off.

Magnetic tunnel junction (MTJ) elements, a resistance-change-type memory (ReRAM), a phase-change memory (PCRAM), or the like have been considered to be adopted as a nonvolatile storage element for retaining data during the power-off period described above.

Examples in which such MTJ elements as mentioned above are used as nonvolatile storage elements are as follows.

FIG. 28 is a circuit diagram of a nonvolatile storage circuit 110 reported in Non Patent Literature 1. The nonvolatile storage circuit 110 comprises: a volatile SRAM 102 comprising six transistors; and two spin-injection-type MTJ elements 113 and 114 connected to the storage nodes C and D of the SRAM 102.

In the nonvolatile storage circuit 110, data is written in the SRAM 102 in a normal writing operation. Further, data is written in the MTJ elements 113 and 114 just before power-off. Since the MTJ elements 113 and 114 are nonvolatile, power supply to the nonvolatile storage circuit 110 can be stopped to allow a stand-by power to be zero in a stand-by state.

FIG. 30 is a circuit diagram of another nonvolatile storage circuit 115 disclosed in Non Patent Literature 1. The nonvolatile storage element 115 comprises n-type MOSFETs 116 and 117 as well as the SRAM102 and spin-injection-type MTJ elements 113 and 114 as in the nonvolatile storage element 110 illustrated in FIG. 28. The n-type MOSFETs 116 and 117 are placed between the SRAM 102 and the MTJ elements 113 and 114.

In the nonvolatile storage circuit 115, the n-type MOSFETs 116 and 117 are turned off to separate the MTJ elements 113 and 114 from the SRAM 102 during writing and reading. Accordingly, writing and reading operations are carried out for the volatile SRAM 102 comprising the six transistors. Just before a stand-by state is achieved, the n-type MOSFETs 116 and 117 are turned on to write data stored in the SRAM102 into the MTJ elements 113 and 114, and then, power supply to the nonvolatile storage circuit 115 is stopped. In such a manner, a stand-by power is allowed to be zero.

FIG. 31 is a circuit diagram of a nonvolatile storage circuit 120 disclosed in Non Patent Literature 2. The nonvolatile storage circuit 120 comprises 32 memory cells 122. Each memory cell 122 comprises four transistors 125 and two spin-injection-type MTJ elements 113 and 114. The 32 memory cells 122 are connected to a PL driver via power lines PL. The PL driver carries out power gating for controlling power supply to the 32 memory cells via the power lines PL.

In an access state, the PL driver carries out the control so that of the 32 memory cells 122 power is supplied only to a memory cell 122 for writing. Thus, data is written in the MTJ elements 113 and 114 of the memory cell 122 for writing. In a stand-by state, the PL driver allows all the power lines PL to be at low levels. Thus, the stand-by power of the nonvolatile storage circuit 120 can be allowed to be zero. In addition, the number of the memory cells 122 to be controlled by the PL driver are a few (in this case, 32), and therefore, processing in switching between the stand-by state and the access state is less time-consuming.

Non Patent Literature 3 describes an SRAM (8TSRAM) which comprises eight transistors and in which a path for exclusive use in reading is disposed to separate the reading path and a writing path from each other.

CITATION LIST

Non Patent Literature

Non Patent Literature 1: S. Yamamoto and S. Sugahara, Jpn. J. Appl. Phys., 48, 043001, 2009

Non Patent Literature 2: T. Ohsawa et al., 2012 Symp. VLSI Circuits Dig. Tech. Papers, pp. 46-47, June 2012

Non Patent Literature 3: L. Chang, D. M. Fried, J. Hergenrother, J. W. Sleight, R. H. Dennard, R. K. Montoye, L. Sekaric, S. J. McNab, A. W. Topol, C. D. Adams, K. W. Guarini, and W. Haensch, Symp.VLSI Technology, pp. 128-129, June 2005

Non Patent Literature 4: M. Hosomi et al., IEDM Tech. Dig., p. 459, 2005

SUMMARY OF INVENTION

Technical Problem

As mentioned above, power in stand-by can be allowed to be zero by using an MTJ element as a nonvolatile storage element. However, there are problems as described below due to the properties of the MTJ element.

FIG. 29 represents a graph representing a relationship between a write time (write pulse width) and a current required for writing in the writing in an MTJ element (see Non Patent Literature 4). As illustrated in the drawing, applying a large current to the MTJ element is required for shortening writing time. Having a large channel width of a transistor included in a storage circuit (memory cell) (for example, the six transistors included in the SRAM 102 in the circuit configuration illustrated in FIG. 28) is necessary for the applying of a large current to the MTJ element. Accordingly, the occupied area of the storage circuit is enlarged.

In the nonvolatile storage circuit 110 (Non Patent Literature 1) illustrated in FIG. 28, writing in the SRAM 102 is carried out whereas writing in the MTJ elements 113 and 114 is not executed in a normal high-speed writing operation.

Data is backed up to the MTJs 113 and 114 by allowing a control line CL which is normally at a ground level (0 V) to rise to a power supply voltage in a slow cycle just before power-off. In the circuit configuration of the nonvolatile circuit 110, it is necessary to back up data to the MTJs or to load data from the MTJs in a large number of cells before power-off or after power activation. Since simultaneous backup or loading of data in many cells results in the generation of noise into a power source or the ground, leading to a malfunction, it is necessary to back up or load the data over several times. Thus, time is required for the backup or loading of the data over the several times, and power consumption is also increased.

In contrast, the nonvolatile storage circuit 120 (Non Patent Literature 2) illustrated in FIG. 31 has a mode in which data is backed up to the MTJ elements 113 and 114 every writing cycle. Accordingly, since power-off can be executed just after the end of a writing cycle every 32 bits, and data can be loaded from the MTJ elements 113 and 114 just after power activation, the backup or loading of data does not require unnecessarily long time. However, there is a problem that a writing cycle must be rate-controlled depending on the switching times of the MTJ elements 113 and 114. Therefore, a large current according to FIG. 29 is required for high-speed writing, and therefore, the larger occupied area of the circuit (memory cell 122) is unavoidable.

In other words, the smaller occupied area of memory cells prevents high-speed writing in the circuit configuration of the nonvolatile circuit 120.

In contrast, in the nonvolatile storage circuit 115 (Non Patent Literature 1) illustrated in FIG. 30, the MTJ elements 113 and 114 are separated from the SRAM 102 during writing and reading, and therefore, high-speed writing is possible regardless of the switching times of the MTJ elements 113 and 114.

However, in the configuration in which data is written on the MTJ elements 113 and 114 just before a stand-by state in a manner similar to that in the nonvolatile storage circuit 110 of FIG. 28, data is written on a large number of the MTJ elements 113 and 114 during writing of data when the storage circuit includes a large number of memory cells. Thus, a large current is instantaneously passed through the circuit, noise is generated due to fluctuations in voltage between $V_{DD}$ and GND, and long time is required for achieving a stand-by state. A large current is similarly instantaneously passed through the circuit just before returning from the stand-by state to an access state, and long time is required for returning to the access state, due to generation of noise. Alternatively, the backup or loading of data may be carried out over several times in order to avoid the noise in a manner similar to that in the storage circuit device 110; however, unnecessarily long time is similarly required.

The SRAM described in Non Patent Literature 3 is not nonvolatile. In addition, the path for exclusive use in reading is disposed, and therefore, the number of transistors included in one memory cell is increased, resulting in the larger occupied area of cells.

The present disclosure is achieved with respect to the problems described above. An objective of the present disclosure is to provide: a storage device which is small and is capable of high-speed writing, and in which little current is passed during stand-by; a memory cell; and a data writing method.

Solution to Problem

In order to achieve the objective described above, a storage device of the present disclosure includes:

a memory cell including a first storage circuit with a write time $t_1$ and a data retention time $\tau_1$ and a second storage circuit with a write time $t_2$ and a data retention time $\tau_2$ ($t_1 < t_2$ and $\tau_1 < \tau_2$);

a power control circuit for controlling power supply to the memory cell; and a write data supply circuit for supplying write data to the memory cell, wherein a data storage node of the first storage circuit and a data storage node of the second storage circuit are connected each other;

the write data supply circuit supplies write data to the memory cell to write the data on the first storage circuit over a write time $t_W$ that is longer than the write time $t_1$ which is a time necessary for writing data on the first storage circuit and that is shorter than the write time $t_2$ which is a time necessary for writing data on the second storage circuit, and stops the supply of the write data after the elapse of write time $t_W$; and the power control circuit supplies power to the memory cell over a time that is longer than the write time $t_2$ of the second storage circuit when the write data is supplied from the write data supply circuit to the memory cell, writes, on the second storage circuit, the data written on the first storage circuit once the supply of the write data is stopped, and stops the supply of the power to the memory cell after a lapse of the write time $t_2$ of the second storage circuit following start of the supply of the write data.

Further, a source control circuit for controlling a power supply voltage of the second storage circuit may be included.

For example, the first storage circuit may include one or more storage elements.

The first storage circuit may include a latch in which two CMOS inverters are cross-coupled.

For example, the second storage circuit may include one or more storage elements.

The second storage circuit includes two switching elements, and switching of the two switching elements may be executed by connecting the two switching elements in series and by passing common current.

For example, the second storage circuit may include a resistance-change-type storage element.

Further, for example, the second storage circuit may include a spin-injection-type MTJ element.

A magnetization direction of the spin-injection-type MTJ element may be generally a direction of a plane in which an integrated circuit is formed, or generally a direction perpendicular to the direction of the plane in which the integrated circuit is formed.

The second storage circuit may include a phase-change-type storage element.

In order to achieve the objective described above, a memory cell of the present disclosure is included in a storage device including: a memory cell including a first storage circuit with a write time $t_1$ and a data retention time $\tau_1$ and a second storage circuit with a write time $t_2$ and a data retention time $\tau_2$ ($t_1 < t_2$ and $\tau_1 < \tau_2$), wherein a data storage node of the first storage circuit and a data storage node of the second storage circuit are connected each other; a power control circuit for controlling power supply to the memory cell; and a write data supply circuit for supplying write data to the memory cell, wherein the write data supply circuit supplies write data to the memory cell to write the data on the first storage circuit over a write time $t_W$ that is longer than the write time $t_1$ which is a time necessary for writing data on the first storage circuit and that is shorter than the write time $t_2$ which is a time necessary for writing data on the second storage circuit, and stops the supply of the write data after the elapse of write time $t_W$; and the power control circuit supplies power to the memory cell over a time that is longer than the write time $t_2$ of the second storage circuit when the write data is supplied from the write data supply circuit to the memory cell, writes, on the second storage circuit, the data written on the first storage circuit once the supply of the write data is stopped, and stops the supply of the power to the memory cell after a lapse of the write time $t_2$ of the second storage circuit following start of the supply of the write data.

The second storage circuit includes two switching elements, and switching of the two switching elements may be executed by connecting the two switching elements in series and by passing common current.

In order to achieve the object described above, a data writing method of the present disclosure includes writing data on a plurality of memory cells including a first storage circuit with a write time $t_1$ and a data retention time $\tau_1$ and a second storage circuit with a write time $t_2$ and a data retention time $\tau_2$ ($t_1 < t_2$ and $\tau_1 < \tau_2$), wherein a memory cell targeted for writing is selected to start supplying power to the memory cell;

concurrently, data is written on the first storage circuit and the second storage circuit in parallel over a write time $t_W$ that is longer than the write time $t_1$ which is a time necessary for writing data on the first storage circuit and that is shorter than the write time $t_2$ which is a time necessary for writing data on the second storage circuit; and the selection of the memory cell is finished after the elapse of write time $t_W$ following start of the writing of the data, the data written on the first storage circuit is written on the second storage circuit, and the supply of the power to the memory cell is stopped after a lapse of the write time $t_2$ of the second storage circuit following the start of the supply of the write data.

Advantageous Effects of Invention

In accordance with the present disclosure, there can be provided a storage device which is small and is capable of high-speed writing, and in which little current is passed during stand-by; a memory cell; and a data writing method.

BRIEF DESCRIPTION OF DRAWINGS

FIG. 10A is a view illustrating the resistance characteristics of a storage element used in a second storage circuit;

FIG. 10B is a view representing the relationship between a state parameter and energy;

FIG. 10C is a time chart representing switching waveforms;

FIG. 16 illustrates timing charts in the case of consecutively selecting a plurality of grains in the second embodiment, in which FIG. 16A is a timing chart in the case of selecting $WL_N$, and FIG. 16B is a timing chart in the case of selecting $WL_{N'}$;

FIG. 17 illustrates timing charts in the case of consecutively selecting a plurality of grains connected to the same WL in the second embodiment, in which FIG. 17A is a timing chart in the case of a certain grain, and FIG. 17B is a timing chart in the case of selecting another grain;

FIG. 22 is a view illustrating timing charts in the case of consecutively selecting a plurality of grains in the third embodiment, in which FIG. 22A is a timing chart in the case of selecting $WL_N$, and FIG. 22B is a timing chart in the case of selecting $WL_{N'}$;

FIG. 23 illustrates timing charts in the case of consecutively selecting a plurality of grains connected to the same WL in the third embodiment, in which FIG. 23A is a timing chart in the case of a certain grain, and FIG. 23B is a timing chart in the case of selecting another grain;

DESCRIPTION OF EMBODIMENTS

Embodiments of the present disclosure will be specifically explained below with reference to the drawings.

(First Embodiment)

Figure 1:
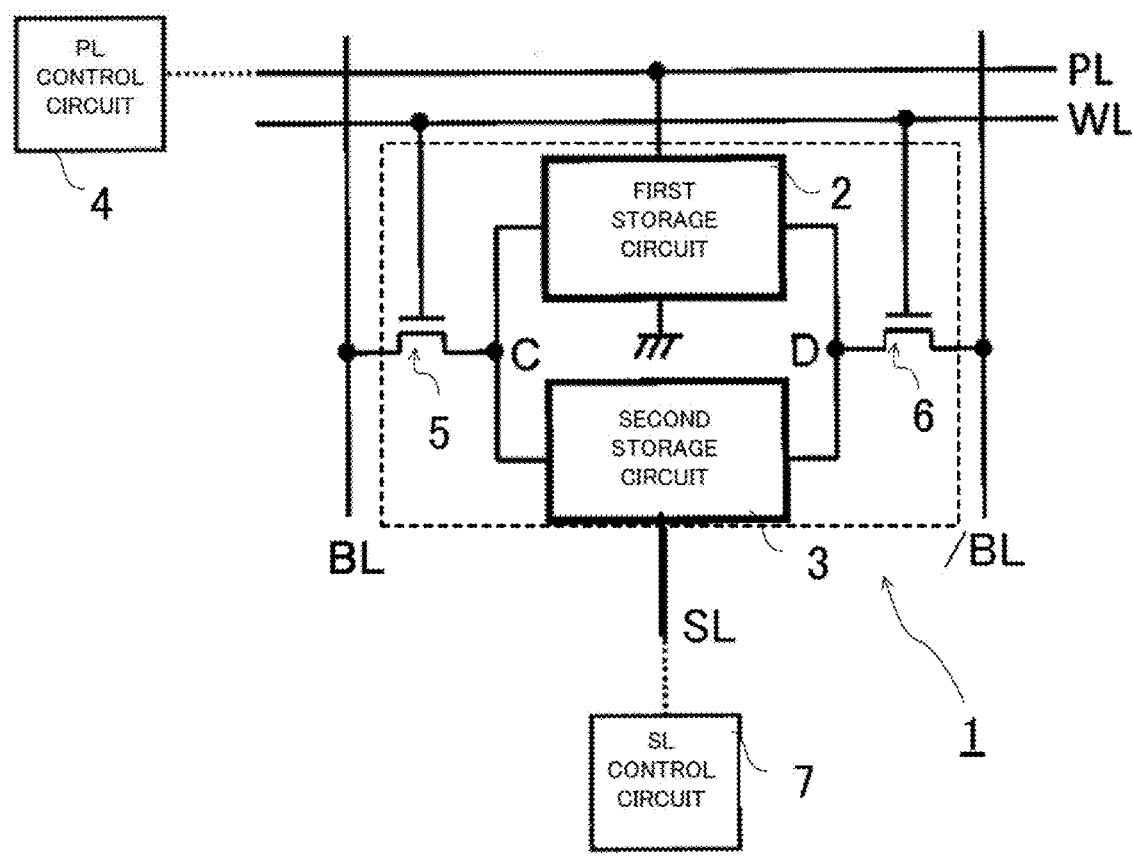
FIG. 1 is a circuit diagram illustrating the basic structure of a memory cell in a semiconductor storage device according to a first embodiment of the present disclosure.

FIG. 1 illustrates the circuit configuration comprising a memory cell 1 according to a first embodiment of the present disclosure. The memory cell 1 comprises a first storage circuit 2, a second storage circuit 3, a first transfer MOSFET 5 (metal oxide semiconductor field effect transistor), and a second transfer MOSFET 6.

A time (hereinafter, write time) necessary for writing data on the first storage circuit 2 is $t_1$, and the write time of the second storage circuit 3 is $t_2$. In this case, $t_1 < t_2$ is satisfied. In other words, data can be written on the first storage circuit 2 at a higher speed than on the second storage circuit 3. A time (hereinafter, data retention time) for which the first storage circuit 2 can retain data is $\tau_1$, the data retention time of the second storage circuit 3 is $\tau_2$, and $\tau_1 < \tau_2$ is satisfied. In other words, the second storage circuit 3 can retain data over a longer period than the first storage circuit 2. For example, the first storage circuit 2 may be a volatile memory capable of high-speed writing, such as an SRAM. The second storage circuit 3 may also comprise an MTJ element. Specific configuration examples of the first storage circuit 2 and the second storage circuit 3 are mentioned later.

As illustrated in the figure, the first storage circuit 2 and the second storage circuit 3 are connected in parallel. Connecting points between the first storage circuit 2 and the second storage circuit 3, denoted by reference characters C and D, are referred to as data storage nodes.

Figure 2:
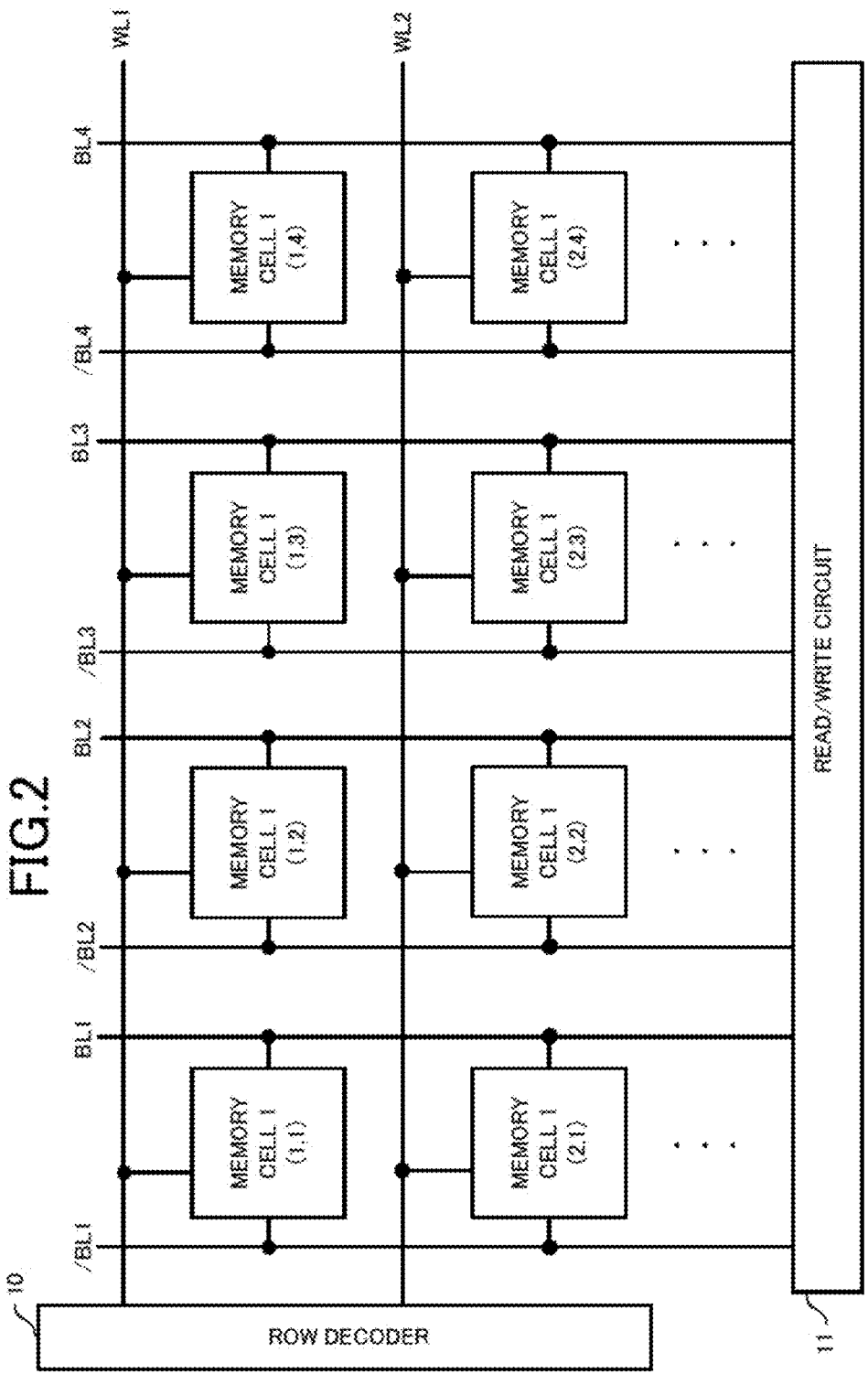
FIG. 2 is a block diagram of the semiconductor storage device comprising a plurality of memory cells of which one is illustrated in FIG. 1.

When a storage circuit is configured using the memory cell 1, a plurality of memory cells 1 are placed in a matrix form, as illustrated in FIG. 2. Memory cells 1 on the same row are connected to a row decoder 10 via an identical word line WL. The row decoder 10 decodes a row address, and selects and drives an arbitrary row based on the decoded address. Accordingly, all the memory cells 1 that are placed on the row are selected. Memory cells 1 on an identical column are connected to a read/write circuit 11 via a pair of bit lines BL and /BL.

During writing of data, the read/write circuit 11 supplies a write signal (write data) to the memory cell 1 via the bit lines BL and /BL to write the data on the memory cell 1. In other words, the read/write circuit 11 is a write data supply circuit for supplying write data to the memory cell 1. During reading of data, the read/write circuit 11 amplifies and outputs data transmitted from the memory cell 1 to the bit lines BL and /BL.

Reference to FIG. 1 is made. The first storage circuit 2 is connected to a PL control circuit 4 via a power line PL. The PL control circuit 4 controlled the voltage of the power line PL connected to the memory cell 1 when the memory cell 1 is accessed. In other words, the PL control circuit 4 controls supply of power to the memory cell 1. In FIG. 2, the power line PL and the PL control circuit 4 are omitted.

The data storage nodes C and D are connected to the bit line BL and the bit line bar /BL via the first transfer MOSFET 5 and the second transfer MOSFET 6.

The gates of the first transfer MOSFET 5 and the second transfer MOSFET 6 are connected to a word line WL.

The second storage circuit 3 is connected to a source control circuit 7 via a source line SL.

The source line SL is commonly connected to, for example, the second storage circuit 3 of a memory cell 1 on the same row.

When a certain memory cell 1 is accessed, the source control circuit 7 allows a source line SL on a row to which the memory cell 1 belongs to be in a grounding or floating state. In FIG. 2, the source line SL and the source control circuit 7 are omitted.

During reading of data, the row decoder 10 sets, at a high level, a word line WL based on a specified row address. In addition, the PL control circuit 4 sets the power line PL at a high level. The SL control circuit 7 allows the source line SL to be in a grounding state (or at a low level) for a very short time after rise of the power line PL, and to be then in a floating state. While the source line SL is allowed to be in the grounding state for the very short time, data stored in the second storage circuit 3 is loaded into the first storage circuit 2.

The word line WL is set at the high level to thereby turn on the first transfer MOSFET 5 and the second transfer MOSFET 6. According to data stored in the first storage circuit 2, a potential difference between the storage nodes C and D is generated. The potential difference is latched into the first storage circuit 2 to which power is supplied through the power line PL. Then, the source line SL may be allowed to be in a floating state.

The voltages of the storage nodes C and D are allowed to definitely differ according to the stored data by the first storage circuit 2 in which the data is latched. The voltages of the storage nodes C and D are transmitted to the bit lines BL and /BL, respectively. The read/write circuit 11 detects a relationship between the voltages of the data storage nodes C and D via the bit lines BL and /BL. In such a manner, data stored in the memory cell 1 is read.

In the reading of the data mentioned above, the PL is set at a high level, the source line SL is allowed to be in a floating state, and therefore, the data is read from the first storage circuit 2. However, for example, it is also possible to set the source line SL at a low level and to read the data from the second storage circuit 3.

With regard to the writing of data, data is written on each storage circuit by such a method as explained below since the memory cell 1 comprises the first storage circuit 2 and the second storage circuit 3 with the different write times.

Figure 3:
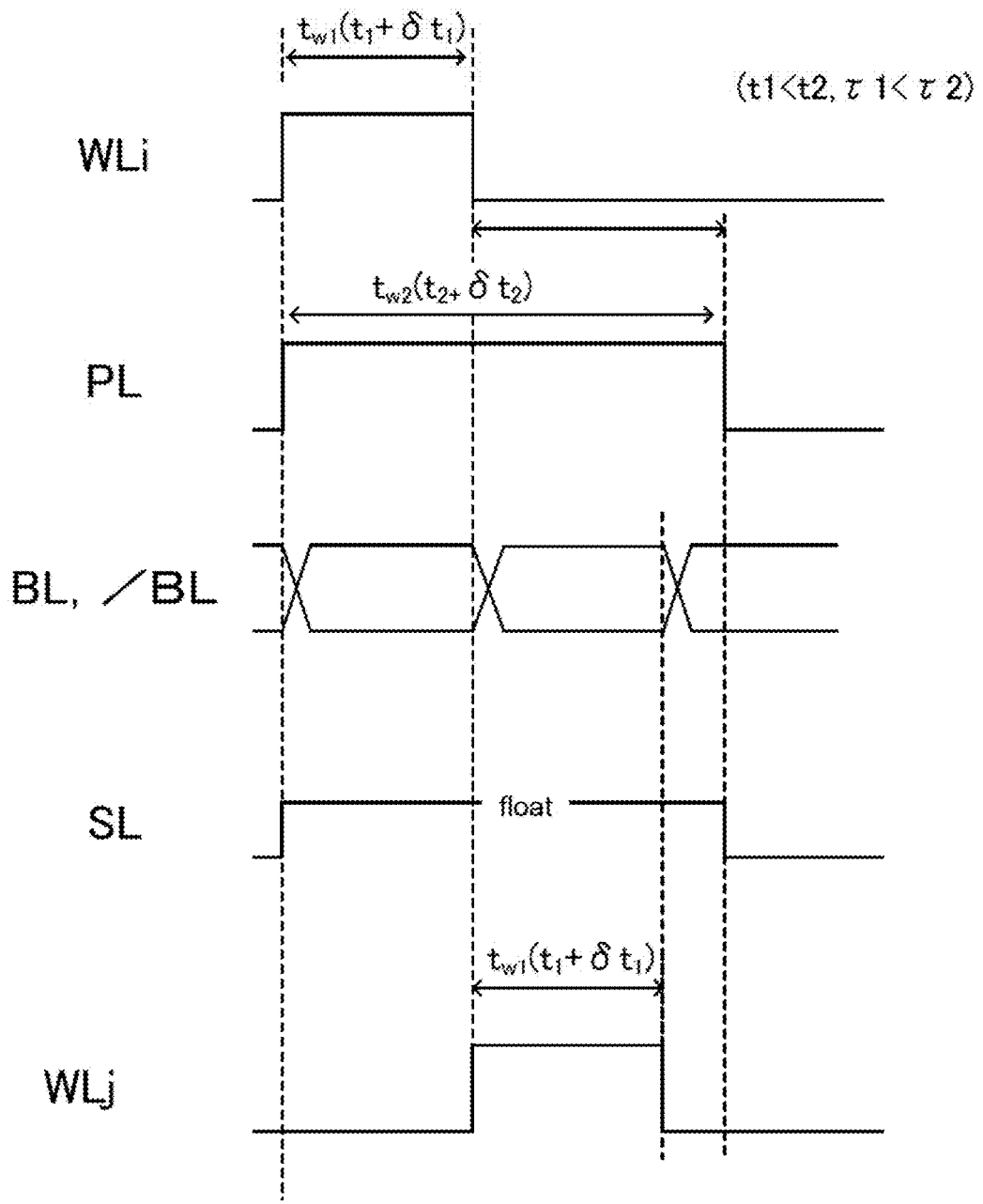
FIG. 3 is a timing chart of the semiconductor storage device.

FIG. 3 illustrates a timing chart in the case of writing data.

When data is written on the memory cell 1, the write time $t_W$ where the word line WL is set at a high level is set to be longer than the write time $t_1$ of the first storage circuit 2. In such a case, the difference between the write times $t_W$ and $t_1$ may be a very short period ($\delta t_1$). An explanation is given assuming that the write time $t_W$ is shorter than the write time $t_2$ of the second storage circuit 3.

The row decoder 10 sets a word line WLi based on a row address at a high level. Almost as soon as the row decoder 10 sets the word line WLi at the high level, the PL control circuit 4 sets the power line PL at a high level. In parallel, the read/write circuit 11 sets a bit line BL, selected based on a column address, at a high level or a low level, and sets a bit line bar /BL at a low level or a high level, according to write data. In addition, the source control circuit 7 continuously allows the source line SL to be in a grounding state (or at a low level) for a very short time after rise of the power line PL, and then allows the source line SL to be in a floating state.

The first transfer MOSFET 5 and the second transfer MOSFET 6 are turned on by setting the word line WLi at a high level. Accordingly, currents depending on the potential difference between the bit line BL and the bit line bar /BL are passed through the first storage circuit 2 and the second storage circuit 3, respectively, via the second transfer MOSFET 6, the first storage circuit 2, and the first transfer MOSFET 5 for the write time $t_W$, to write data on the first storage circuit 2 and the second storage circuit 3 in parallel.

After a lapse of the write time $t_W$, the word line WL is returned to a low level. Then, a word line WLj connected to the next memory cell 1 targeted for access is set at a high level.

Even after the return of the word line WLi to the low level, the PL control circuit 4 continuously maintains the power line PL at a high level until a lapse of a predetermined time. The writing of the data on the first storage circuit 2 has been completed in the stage of the lapse of the write time $t_W$. In contrast, the writing of the data on the second storage circuit 3 has not been completed. Accordingly, the data stored in the first storage circuit 2 is written on the second storage circuit 3.

A time $t_{W2}$ for which the power line PL maintains the high level is set to be longer than the write time $t_2$ of the second storage circuit 3. In such a case, the difference between the time $t_{W2}$ and the write time $t_2$ may be a very short period ($\delta t_2$).

After a lapse of the write time $t_{W2}$, the PL control circuit 4 returns the power line PL to a low level. In parallel, the source control circuit 7 allows the source line SL to be in a grounding state (or at a low level). However, the PL control circuit 4 maintains the power line PL at a high level when the next memory cell 1 targeted for access is connected to the same power line PL.

The time $t_{W2}$ for writing data on the second storage circuit 3 is set to be a time ($t_2+\delta t_2$) sufficient for writing on the second storage circuit 3. Therefore, writing on the storage circuit 3 is executed utilizing data stored in the first storage circuit 2 independently of the external write cycle even after the end of a write cycle judging from the outside.

In such a configuration, data can be stored in the second storage circuit 3, of which the time of writing data is longer than that of the first storage circuit 2, without the need for maintaining the word line WL at a high level for a needlessly long time.

For example, when the data retention time $\tau_2$ of the second storage circuit 3 is a long period of 10 years, data in the first storage circuit 2 can be restored utilizing data stored in the second storage circuit 3 after reactivation of power even in the case of stopping the supply of power to the memory cell 1 for a period that is longer than the data maintain period $\tau_1$ of the first storage circuit 2 after writing on the storage circuit 3. In such a manner, a nonvolatile memory can be implemented. In addition, a stand-by current can be allowed to be approximately zero by stopping the supply of the power to the memory cell 1 after the writing on the storage circuit 3.

In the explanation mentioned above, data is written on the first storage circuit 2 and the second storage circuit 3 in parallel during the write time $t_W$. However, for example, data is written only on the first storage circuit 2 in the write time $t_W$, and data may be written only on the first storage circuit 2 while the power line PL maintains a high level after a lapse of the write time $t_W$, that is, after returning of the word line WLi to a low level.

(Second Embodiment)

An example of a storage device in which the memory cell 1 mentioned above is used will be explained below.

In the storage device 20 according to a second embodiment, the memory cell 1 according to the first embodiment is used. The storage device 20 carries out power gating for supplying power to memory cells 1 on the basis of a group (hereinafter, grain) including the plural memory cells 1 as a unit.

Figure 4:
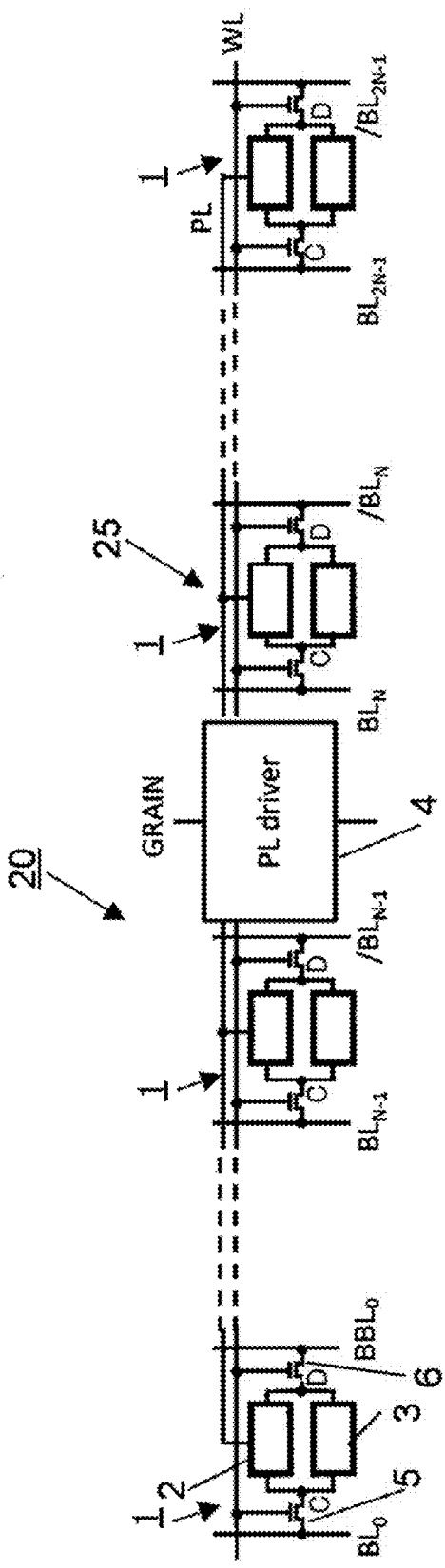
FIG. 4 is a block diagram illustrating the configuration of a storage device of a second embodiment.

FIG. 4 is a block diagram illustrating the configuration of a grain 25 included in the storage device 20. The grain 25 includes $2^N$ memory cells 1 on the same word line (N is an integer). For example, $2^N$ is 16, 32, 64, or the like. The configuration of the memory cell 1 is similar to that of the first embodiment. The reading and writing methods of the memory cell 1 are also similar to those of the first embodiment.

A PL control circuit 4 is assigned to each grain 25. The PL control circuit 4 and each memory cell 1 are connected to each other via a power line PL. The PL control circuit 4 is connected to a controller (not illustrated) via a control line GRAIN. The controller is connected to a plurality of grains 25 (PL control circuit 4) on the same word line via the control line GRAIN. The controller selects one grain 25 on a word line WL selected by a row decoder 10, of a plurality of grains 25 included in the storage device 20, through the control line GRAIN. Accordingly, the PL control circuit 4 assigned to the grain 25 selected through the control line GRAIN is activated.

Accordingly, power is supplied to the memory cell 1 connected to the activated PL control circuit 4, of the memory cells 1 on the same word line WL. In such a manner, data can be written on the basis of a grain as a unit.

As mentioned above, in the memory cell 1 according to the first embodiment, the data retention time $\tau_2$ of the second storage circuit 3 is set to be longer than the data retention time $\tau_1$ of the first storage circuit 2. For example, configuration of the data retention time $\tau_2$ of the second storage circuit 3 as 10 years or more can results in implementation of a nonvolatile memory.

A storage element used in the second data storage circuit 3 will be mentioned below.

For example, the second data storage circuit 3 can be configured using a nonvolatile storage element such as a magnetic tunnel junction (MTJ) element, a resistance-change-type memory (ReRAM), or a phase-change memory (PCRAM).

Figure 5A:
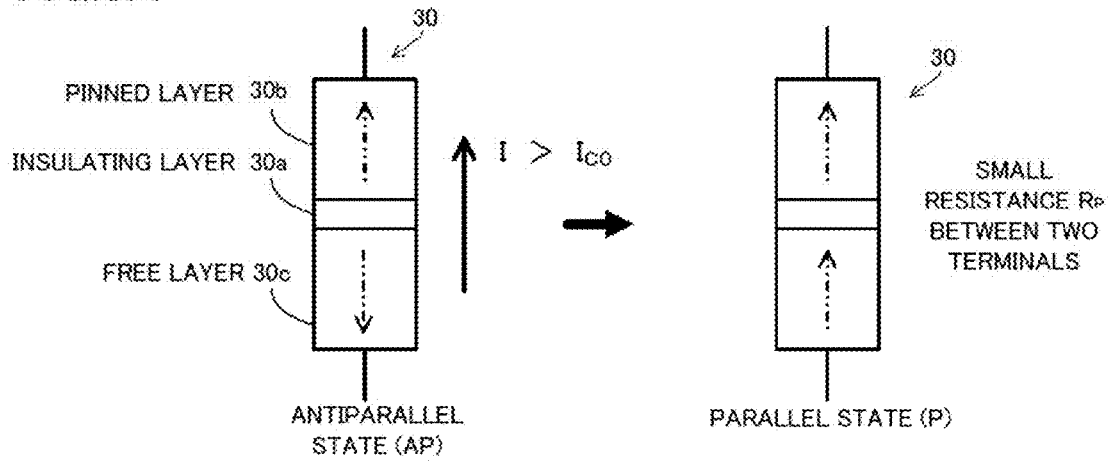
FIG. 5A is a view illustrating the structure of an MTJ element and the situation of a change in state in the case of passing current to the MTJ element.
Figure 5B:
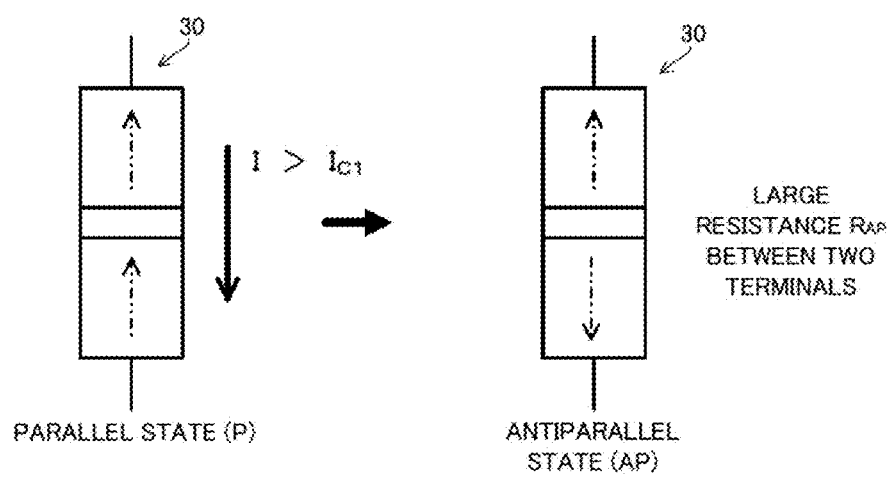
FIG. 5B is a view illustrating the structure of an MTJ element and the situation of a change in state in the case of passing current to the MTJ element.
Figure 5C:
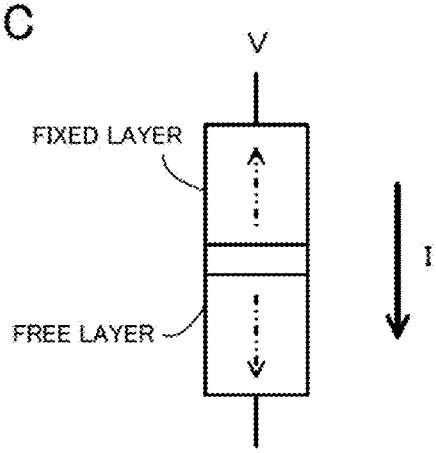
FIG. 5C is a view illustrating the situation of application of a voltage for passing current to an MTJ element.
Figure 6:
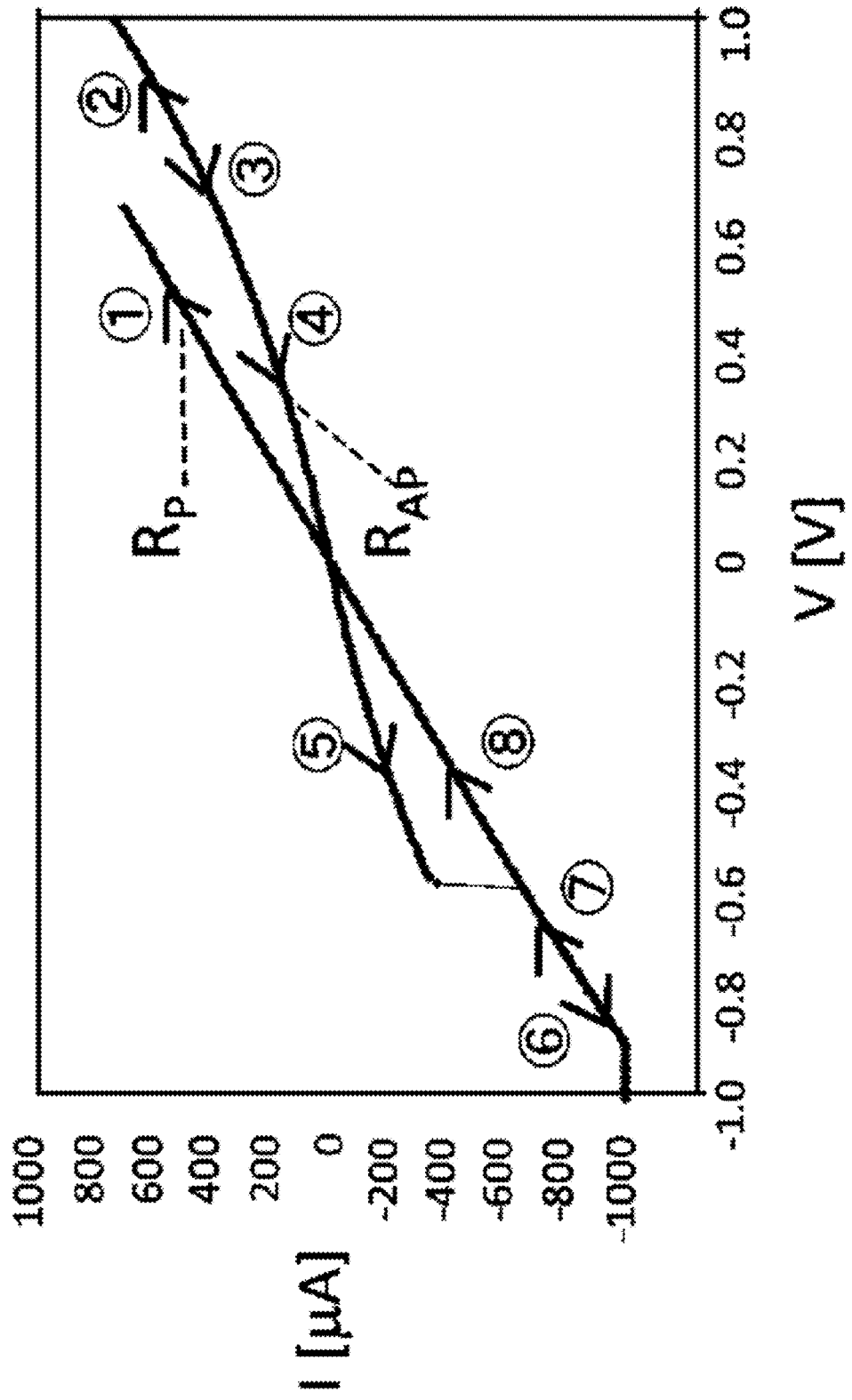
FIG. 6 is a view representing the voltage-current characteristics of an MTJ element.

Each of FIGS. 5A and 5B illustrates the structure of the MTJ element 30 and the situation of a resistance change. FIG. 5C is a view for explaining resistance characteristics. FIG. 6 is a view representing the current-voltage characteristics representing the resistance change of the MTJ element 30.

As illustrated in FIGS. 5A and 5B, the MTJ element 30 comprises a fixed layer 30b and a free layer 30c, separated by a tunnel barrier layer 30a. The fixed layer 30b is a layer of which the magnetization direction denoted by an up arrow (↑) is fixed. The fixed layer 30b is also referred as a ferromagnetic fixed layer. The free layer 30c is a layer of which the magnetization direction is not fixed. The free layer 30c is also referred as a ferromagnetic free layer. The tunnel barrier layer 30a is formed with a thin film of MgO or $Al_2O_3$. The fixed layer 30b and the free layer 30c are formed with a single layer or a plurality of layers, comprising a ferromagnetic body, such as iron (Fe) or cobalt (Co), or an alloy thereof.

As illustrated in the left of FIG. 5A, a state in which the magnetization directions of the fixed layer 30b and the free layer 30c are reverse is referred as an antiparallel state. As illustrated in the left of FIG. 5B, a state in which the magnetization directions of the fixed layer 30b and the free layer 30c are substantially the same is referred as a parallel state.

As illustrated in FIG. 5C, current I is passed by applying a voltage V to the MTJ element 30. FIG. 6 illustrates a view representing current-voltage characteristics representing the resistance change of the MTJ element 30. As illustrated in FIG. 6, the resistance state of the MTJ element 30 is changed by passing forward or reverse current to the MTJ element 30. As illustrated in FIGS. 5A and 5B, in a case in which the MJT element 30 is in the antiparallel state, the magnetization direction of free layer 30c is inverted to allow the MTJ element 30 to transit to the parallel state when forward current is passed to the MTJ element 30 and the current I exceeds a predetermined value ($I_{c0}$). In a case in which the MTJ element 30 is in the parallel stage, the magnetization direction of the free layer 30c is inverted to allow the MTJ element 30 to transit to the antiparallel state when reverse current is passed to the MTJ element 30 and the current I exceeds a predetermined value ($I_{c1}$).

In the parallel state, the resistance value of the MTJ element 30 is low (low resistance state), and is represented by $R_P$. In the antiparallel state, the resistance value of the MTJ element 30 is high (high resistance state), and is represented by $R_{AP}$. In the memory in which the MTJ element 30 is used, information is stored by passing forward or reverse current to the MTJ element 30, changing the resistance state, and associating the respective states with "0" and "1". A method in which the magnetization direction of the free layer 30c is changed by passing current to the MTJ element 30 in such a manner is referred as a spin injection method or spin injection magnetization inversion. In the method, an external magnetic field for changing the magnetization of the free layer 30c is unnecessary.

The ReRAM will be explained below.

Figure 7A:
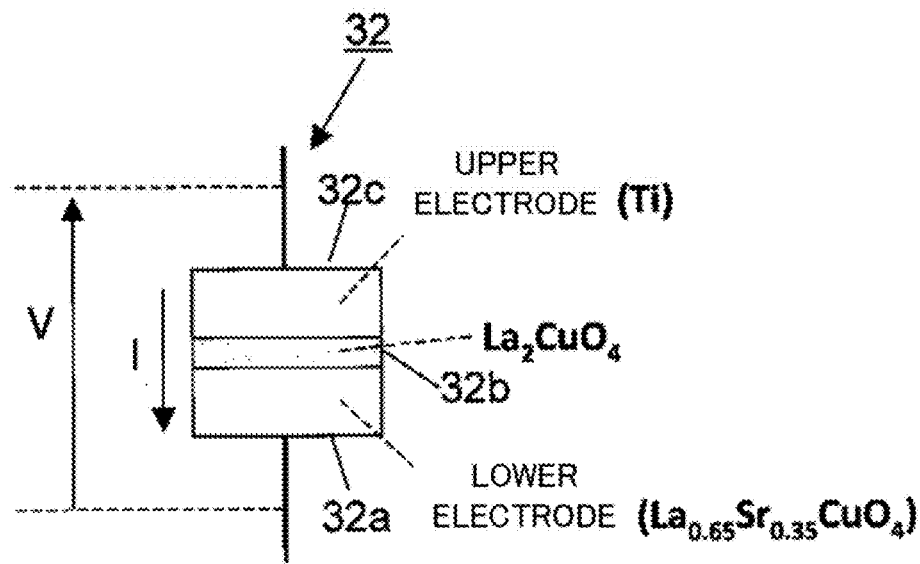
FIG. 7A is a cross-sectional view of a memory cell in a ReRAM.
Figure 7B:
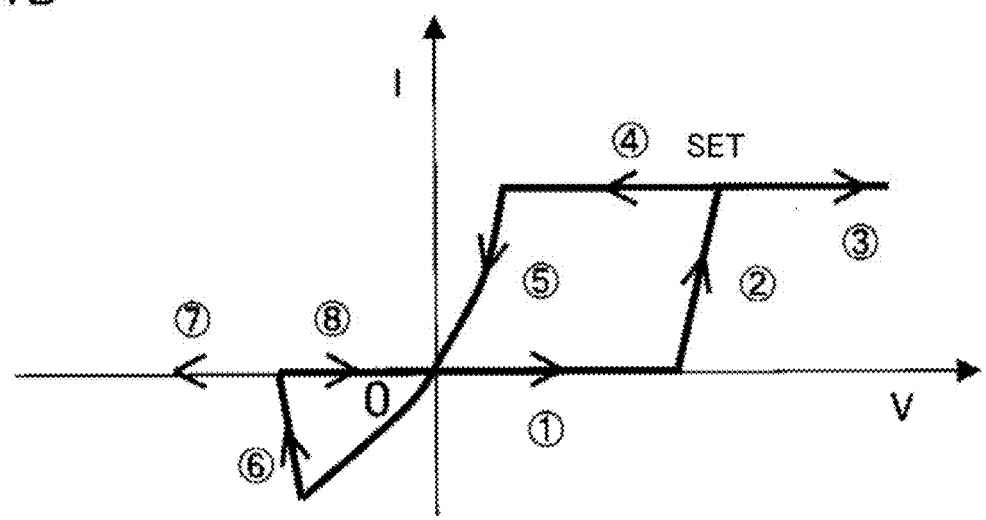
FIG. 7B is a view of the voltage-current characteristics of the memory cell in the ReRAM.

FIG. 7A is a cross-sectional view illustrating the structure of a memory cell 32 in the ReRAM. FIG. 7B represents the current voltage characteristics of the memory cell 32. As illustrated in FIG. 7A, the memory cell 32 in the ReRAM comprises a lower electrode 32a, a metal oxide layer 32b, and an upper electrode 32c, which are sequentially layered. In FIG. 7A, perovskite-based composite oxide is used as the metal oxide layer 32b.

In FIG. 8, a memory cell having another structure in the ReRAM is illustrated.

Figure 8A:
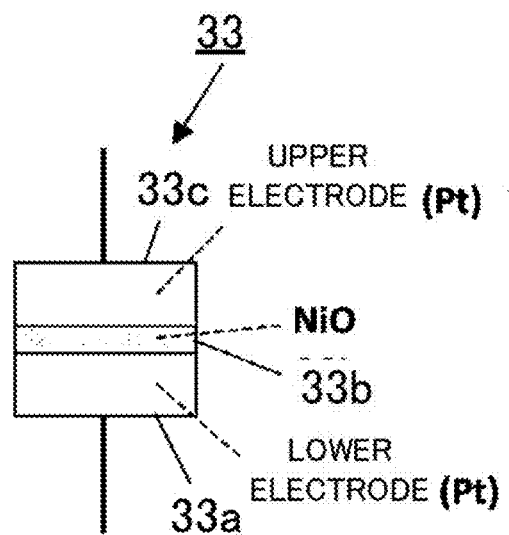
FIG. 8A is a cross-sectional view of a memory cell having another structure in the ReRAM.
Figure 8B:
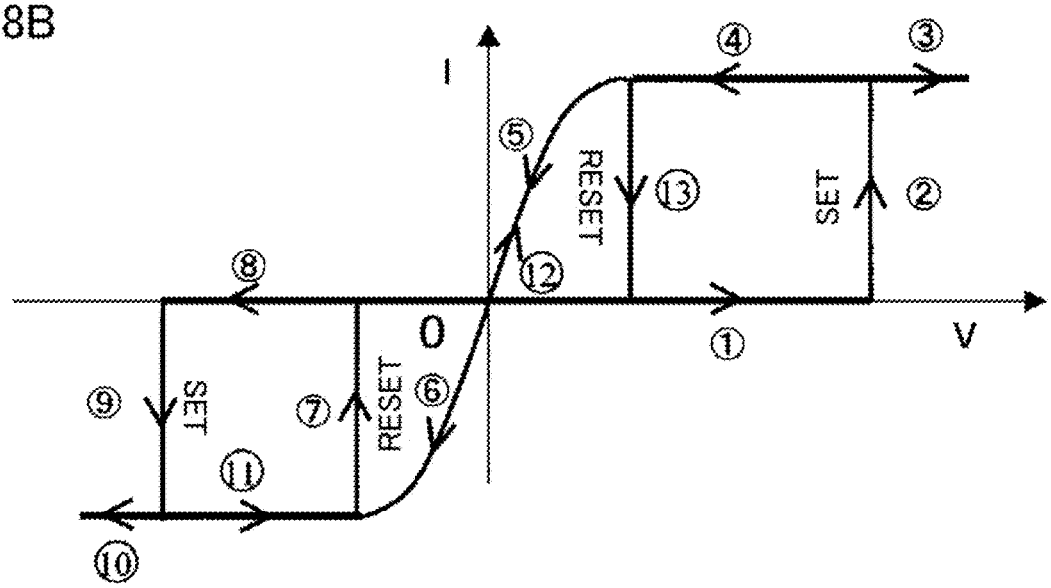
FIG. 8B is a view of the voltage-current voltage characteristics of the memory cell having the other structure in the ReRAM.

FIG. 8A is a cross-sectional view illustrating the structure of a memory cell 33 in the ReRAM. FIG. 8B represents the current voltage characteristics of the memory cell 33. In a manner similar to that in the memory cell 32, the memory cell 33 comprises a lower electrode 33a, a metal oxide layer 33b, and an upper electrode 33c, which are sequentially layered. A difference from the memory cell 32 is in that a binary oxide such as NiO, FeO, or $TiO_2$ is used in the metal oxide layer 33b as illustrated in FIG. 8A.

As illustrated in FIG. 7B and FIG. 8B, in each of the memory cell 32 and the memory cell 33, the resistance value of the metal oxide layer 32b (or 33b) is varied by application of a voltage between the lower electrode 32a (or 33a) and the upper electrode 32c (33c). Utilizing the characteristics, information can be stored in association of the high resistance state and low resistance state of the metal oxide layer 32b (or 33b) in the ReRAM with "1" and "0".

The PCRAM (phase change random access memory, phase-change memory) will be explained below.

Figure 9A:
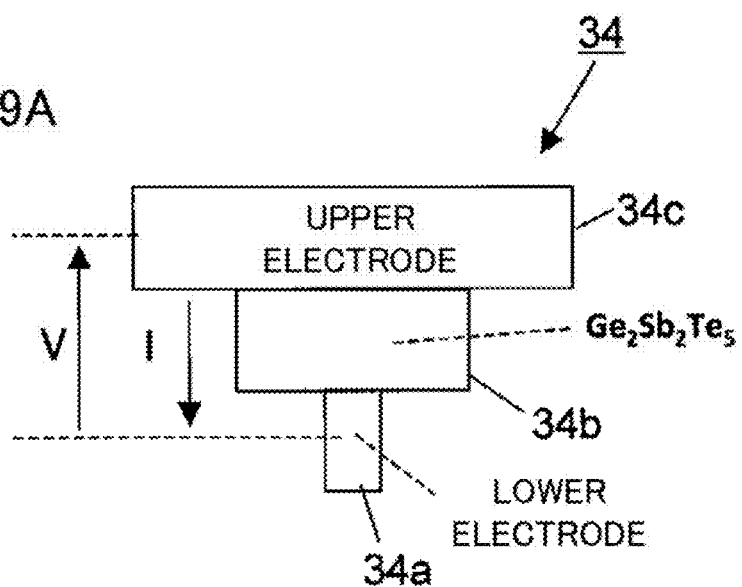
FIG. 9A is a cross-sectional view of a memory cell in a PCRAM.
Figure 9B:
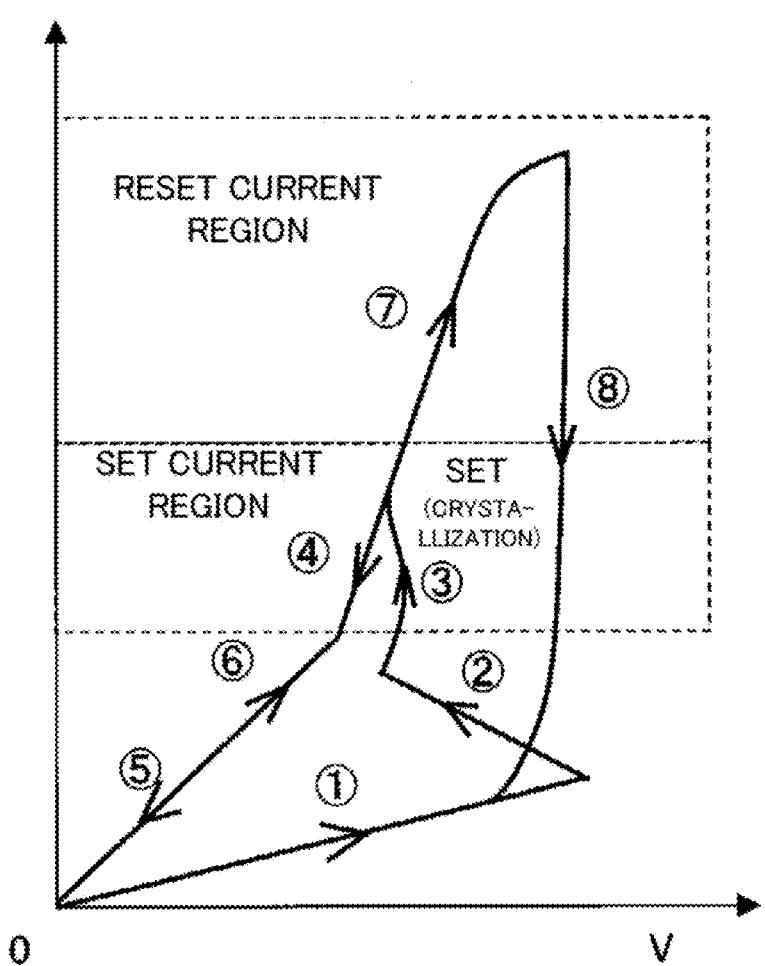
FIG. 9B is a view of the voltage-current characteristics of the memory cell in the PCRAM.

FIG. 9A is a cross-sectional view illustrating the structure of a memory cell 34 in the PCRAM. FIG. 9B is a view representing current voltage characteristics. As illustrated in FIG. 9A, the memory cell 34 in the PCRAM comprises a lower electrode 34a, a chalcogenide layer 34b, and an upper electrode 34c, which are sequentially layered. The material of the chalcogenide layer 34b is, for example, $Ge_2Sb_2Te_5$.

As illustrated in FIG. 9B, the current voltage characteristics of the memory cell 34 in the PCRAM are changed depending on the state of the chalcogenide layer 34b. A low resistance state is achieved when the chalcogenide layer 34b is crystalline, whereas a high resistance state is achieved when the chalcogenide layer 34b is amorphous. In the memory cell 34 in the PCRAM, information can be stored in association of the high resistance state and low resistance state of the chalcogenide layer 34b described above with "1" and "0".

As mentioned above, in each of the MTJ element, the ReRAM, and the PCRAM, information is stored by carrying out switching between the high resistance state and the low resistance state.

A time for switching of the resistance state of each of the storage elements will be explained below. FIG. 10A is a view for explaining the resistance characteristics, FIG. 10B is a view representing the relationship between a state parameter and energy, and FIG. 10C is a time chart representing a time for switching of a resistance element.

As illustrated in FIG. 10A, current I is passed by applying a voltage Vp to a storage element. In the storage element (MTJ element, ReRAM, PCRAM, or the like) used in the second storage circuit 3 mentioned above, the current I passed by the voltage Vp is changed. In other words, the resistance state is changed from high resistance to low resistance by applying the voltage Vp. For example, the high resistance and the low resistance can be stored in association with "1" and "0", respectively. In general, as illustrated in FIG. 10B, the storage element is known to have two low-energy states of "0" and "1", between which a barrier with an energy E is present, thereby stably retaining data. Rewriting of data means that energy greater than the barrier E is applied to a system to switch the system to an opposite state. As illustrated in FIG. 10C, the current I starts to vary at conclusion of a lapse of a time $t_A$ after the application of the voltage Vp, and further, the current I becomes in a steady-state after a lapse of a time $t_B$.

In other words, the switching of the storage element requires a time of $t_A+t_B$ from the start of the application of energy to the storage element to the switching. It is assumed that $t_A$ is a latent time, and $t_B$ is a transition time.

According to the storage device 20 of the present embodiment, a stand-by current can be allowed to be approximately zero by carrying out the writing of data, written on the first storage circuit 2, on the second storage circuit 3 for the time of ($t_A+t_B$) that is not less than the write time $t_2$ and then carrying out power-off. Further, the occupied area of the first storage circuit 2 can be reduced. Normal writing and reading are ensured even when a stand-by time is prolonged to a data retention time $\tau_2$. In the case of $\tau_2 > 10$ years, a nonvolatile memory can be implemented.

(Specific Example of First Embodiment)

A specific example of the memory cell 1 used in the storage device 20 illustrated in FIG. 4 will be explained below.

Figure 11:
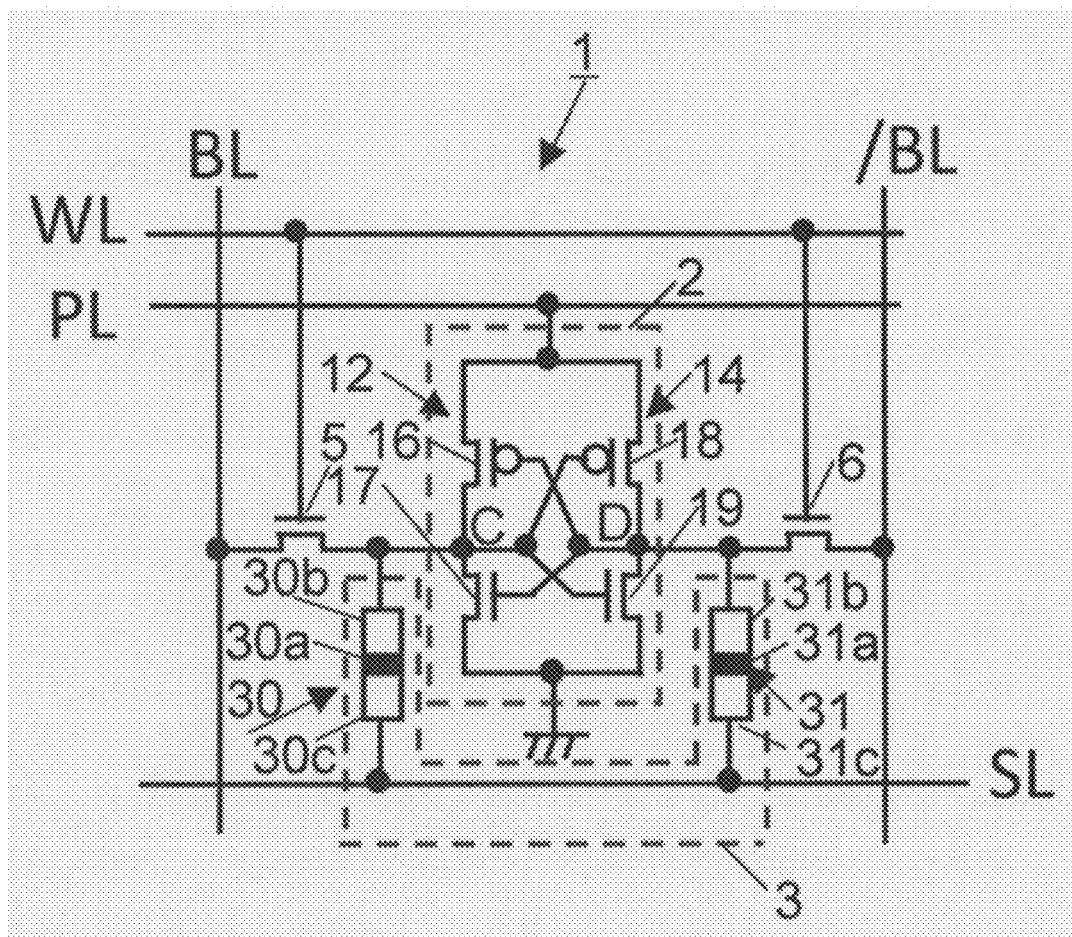
FIG. 11 is a circuit diagram illustrating a specific example of a memory cell used in a storage device according to the first embodiment.
Figure 12:
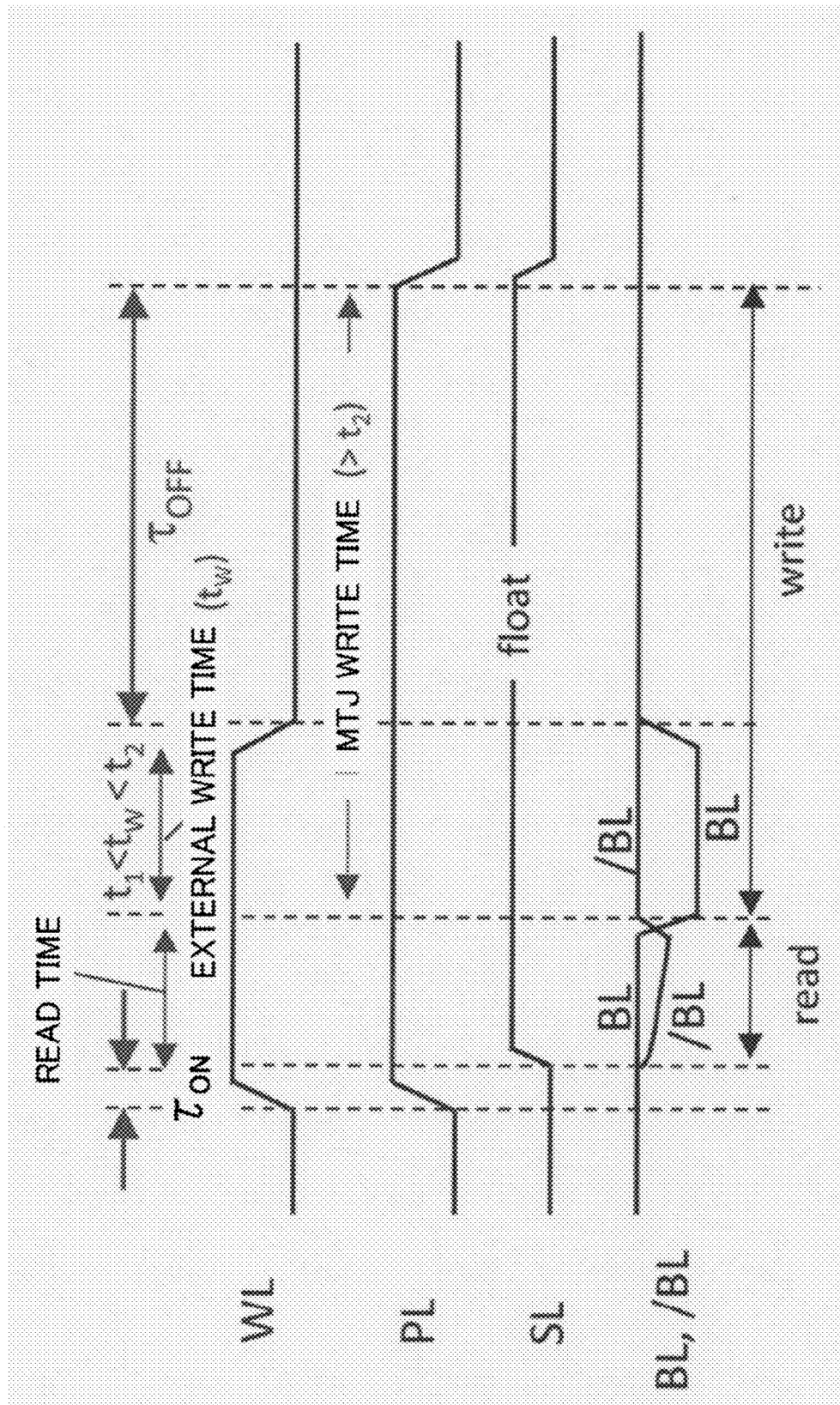
FIG. 12 is a timing chart of the storage device comprising the memory cell illustrated in FIG. 11.

FIG. 11 is a circuit diagram of the specific example of the memory cell 1. FIG. 12 is a timing chart.

In such a case, the first storage circuit 2 comprises a so-called SRAM, and the second storage circuit comprises MTJ elements 30 and 31.

The first storage circuit 2 comprises a first inverter 12, a first transfer n-type MOSFET 5 connected to the first inverter 12, a second inverter 14, and a second transfer n-type MOSFET 6 connected to the second inverter 14.

The first inverter 12 comprises a first p-type MOSFET 16 as a load and a first driving n-type MOSFET 17. The drain of the first driving n-type MOSFET 17 is connected to the drain of the first p-type MOSFET 16, and the source of the first driving n-type MOSFET 17 is grounded. The gate of the first driving n-type MOSFET 17 is connected to one end of the main electrode of the second transfer n-type MOSFET 6. The other end of the main electrode of the second transfer n-type MOSFET 6 is connected to a bit lines bar /BL, and the gate of the second transfer n-type MOSFET 6 is connected to a word line WL.

The second inverter 14 comprises a second p-type MOSFET 18 as a load and a second driving n-type MOSFET 19. The drain of the second driving n-type MOSFET 19 is connected to the drain of the second p-type MOSFET 18, and the source of the second driving n-type MOSFET 19 is grounded. The gate of the second driving n-type MOSFET 19 is connected to one end of the main electrode of the first transfer n-type MOSFET 5. The other end of the main electrode of the first transfer n-type MOSFET 5 is connected to BL, and the gate of the first transfer n-type MOSFET 5 and the gate of the second transfer n-type MOSFET 6 are connected to the word line WL.

Both sources of the first and second p-type MOSFETs 16 and 18 are connected to a power line PL.

Both sources of the first and second driving n-type MOSFETs 17 and 19 are connected to each other. In the example illustrated in FIG. 4, the sources are grounded.

The drain of the first driving n-type MOSFET 17 is connected to the gate as the input terminal of the second driving n-type MOSFET 19. The drain of the second driving n-type MOSFET 19 is connected to the gate as the input terminal of the first driving n-type MOSFET 17. The connection of the drains and gates of the first driving n-type MOSFETs 17 and 19 is referred to as cross-type (also referred as cross couple) wiring or cross-coupling wiring.

The first inverter 12 and the second inverter 14 are included in an SRAM. The SRAM comprises a latch in which two CMOS inverters are cross-coupled and which is also referred as a CMOS latch.

The second storage circuit 3 comprises the first spin-injection-type MTJ element 30 and the second spin-injection-type MTJ element 31.

One of the first spin-injection-type MTJ element 30 is connected to a connecting point C (also referred to as a data storage node or a connection node) between the output terminal of the first inverter 12 and the first transfer n-type MOSFET 5. One end of the second spin-injection-type MTJ element 31 is connected to a connecting point D (also referred to as a data storage node or a connection node) between the output terminal of the second inverter 14 and the second transfer n-type MOSFET 6. Both other ends of the first and second spin-injection-type MTJ elements 30 and 31 are connected to a source line SL.

In the first spin-injection-type MTJ element 30, a layer between a fixed layer 30b and a free layer 30c is a tunnel barrier layer 30a.

The operation of the memory cell 1 will be explained below.

In the following explanation, it is assumed that the memory cell 1 illustrated in FIG. 11 is connected to a PL control circuit 4, an SL control circuit 7, and the like in a manner similar to that illustrated in FIG. 1.

In addition, signals applied to the source line SL, the word line WL, the power line PL, the bit line BL, and the bit line bar /BL are abbreviated as SL, WL, PL, BL, and /BL, respectively, below.

FIG. 12 illustrates the voltage waveforms of WL, PL, SL, BL, and /BL from the top to the bottom.

(Writing on First Storage Circuit)

The timing chart illustrated in FIG. 12 represents a cycle in which just after reading of data from the memory cell 1 of FIG. 11, data reverse to the data is written.

The word line WL and the power line PL are simultaneously allowed to rise to high levels while keeping SL at a low level during a time $\tau_{ON}$. Thus, data stored in the first and second spin-injection-type MTJ elements 30 and 31 is read into a CMOS latch circuit (first storage circuit 2). Then, when reverse data is input by inversion of BL and /BL, the operation of writing on the CMOS latch circuit is executed. At conclusion of a lapse of a time $t_w$, the word line WL is set at a low level to finish the external writing operation. During a period in which data is written on the CMOS latch circuit (first storage circuit 2) and the spin-injection-type MTJ elements 30 and 31 (second storage circuit 3), the SL control circuit 7 controls SL to be in a floating state. In such a case, SL is actually fixed on an intermediate potential between the potentials of BL and /BL. The potentials of BL and /BL depend on the resistance ratio of the first and second spin-injection-type MTJ elements 30 and 31 (second storage circuit 3).

(Writing of Second Storage Circuit)

In a case in which the write time $t_w$ of the CMOS latch circuit (first storage circuit) is shorter than the write time of the spin-injection-type MTJ elements 30 and 31 (second storage circuit 3), new data is not yet written on the spin-injection-type MTJ elements 30 and 31 (second storage circuit 3) when WL is at a low level after a lapse of the write time $t_w$. However, the PL control circuit 4 further controls PL to be at a high level over a time of $\tau_{OFF}$, and the SL control circuit 7 controls SL to be in a floating state. Therefore, write current is passed in series to the first and second spin-injection-type MTJ elements 30 and 31 (see FIG. 11). Thus, writing on the second storage circuit 3 is correctly executed using new data written on the first storage circuit 2. The switching of the first and second spin-injection-type MTJ elements 30 and 31 is ensured by setting $\tau_{OFF}$ at not less than the switching time (write time $t_2$) of the first and second spin-injection-type MTJ elements 30 and 31, even when a pulse width (time $t_w$) input into WL is shorter than the time $t_2$.

Since the memory cell 1 mentioned above comprises the six transistors and the two spin-injection-type MTJ elements 30 and 31, the occupied area of the cell can be allowed to be small. Thus, the storage device can be downsized. Further, since the storages states of the MTJ elements 30 and 31 can be retained over a long period without applying power by controlling the power line PL, power consumption can be reduced.

(Specific Example of Second Embodiment)

A specific example of the storage device 20 according to the second embodiment illustrated in FIG. 4 will be explained below.

Figure 13:
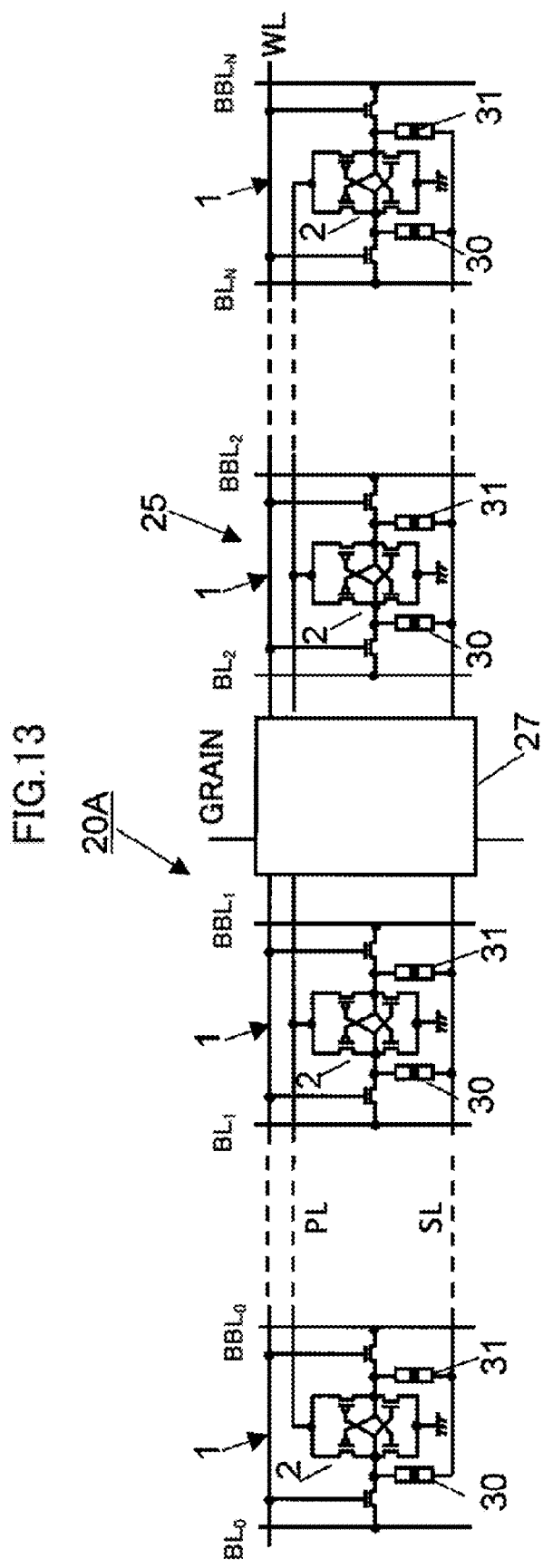
FIG. 13 is a block diagram of a semiconductor storage device comprising a plurality of memory cells of which one is illustrated in FIG. 11.
Figure 14:
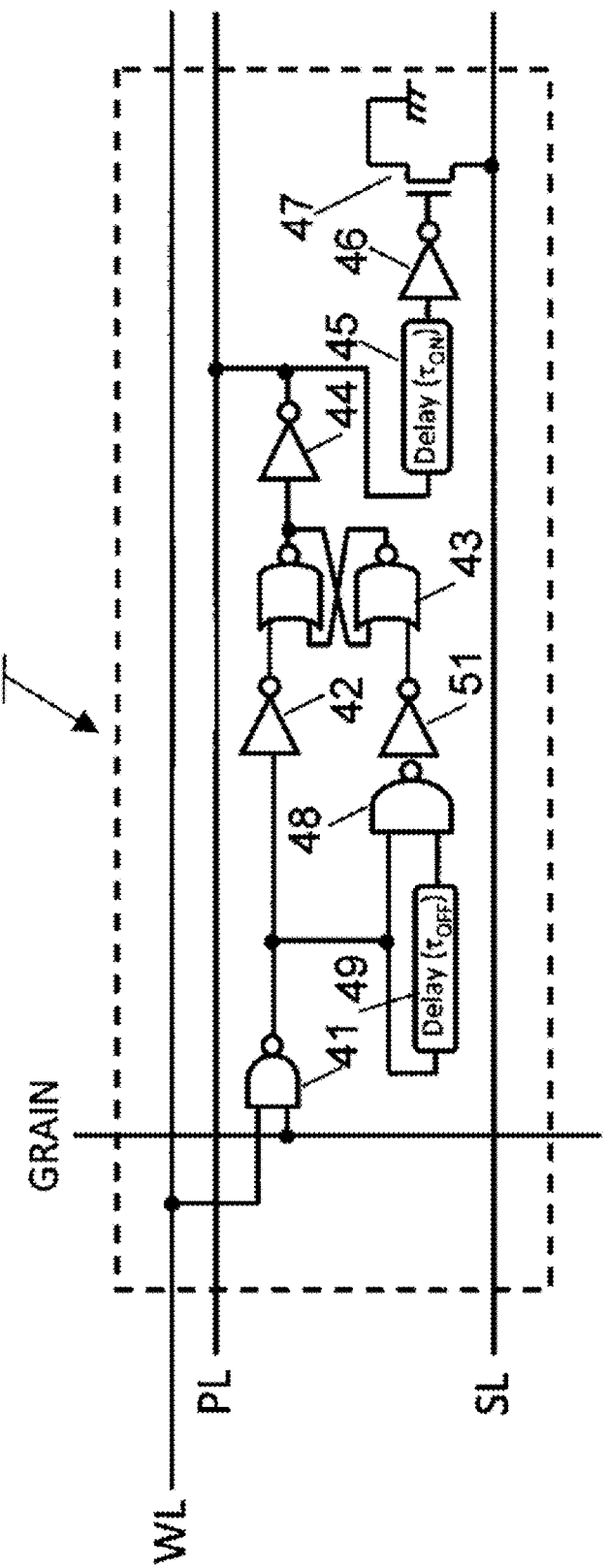
FIG. 14 is a circuit diagram of a PL/SL driver of a grain according to the second embodiment.

In FIG. 13, the circuit configuration of a storage device 20A is illustrated as the specific example of the storage device 20. FIG. 14 is a circuit diagram of a PL/SL driver 27 in the grain 25. As illustrated in FIG. 13, in the storage device 20A, plural memory cells 1 are placed in each row, and the plural memory cells 1 are included in each grain 25.

As illustrated in FIG. 14, the PL/SL driver 27 comprises: a first two-input NAND 41 into which WL and GRAIN are input; a first inverter 42 connected to the output of the first two-input NAND 41; a flip-flop 43 connected to the first inverter 42; a second inverter 44 connected to the output of the flip-flop 43; a first delay circuit 45 (delay time of $\tau_{ON}$) connected to the output of the second inverter 44; a third inverter 46 connected to the delay circuit 45; and an n-type MOSFET 47 connected to the third inverter 46. The PL/SL driver 27 further comprises: a second two-input NAND 48 connected to the output of the first two-input NAND 41; a second delay circuit 49 (delay time of $\tau_{OFF}$) connected to the input of this the second two-input NAND 48; and the fourth inverter 51 connected to the output of the second two-input NAND.

In the grain 25 in which a GRAIN signal is set at a high level, PL is allowed to rise simultaneously with rise of WL, and SL dropped to GND is allowed to be in a floating state after a lapse of the delay time of $\tau_{ON}$. PL is dropped to GND after a lapse of the delay time of $\tau_{OFF}$ from fall of WL.

(Configuration of Sub-array of m×n×N Bits)

Figure 15:
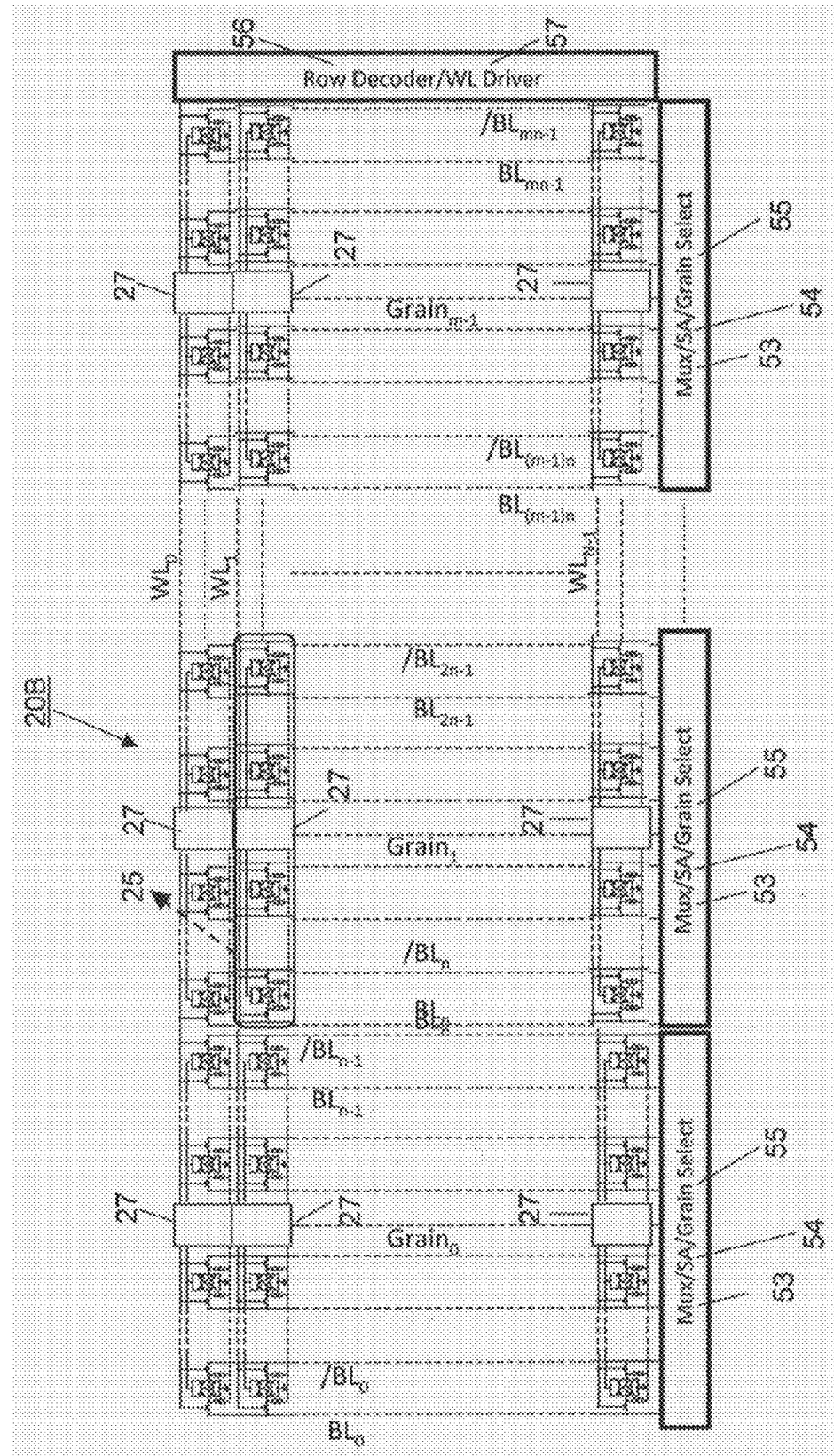
FIG. 15 is a block diagram illustrating the configuration of a storage device comprising a sub-array of m×n×N bits according to an embodiment of the present disclosure.

An example in which the grains 25 mentioned above are placed as a sub-array. FIG. 15 illustrates the configuration of a storage device 20B comprising a sub-array 50 of m×n×N bits of the present disclosure. The storage device 20B comprises the plural grains 25 (grain$_0$, grain$_1$, . . . , and grain$_{m-1}$). Each of the grain 25 (grain$_0$, grain$_1$, . . . , and grain$_{m-1}$) is connected to a multiplexer (MUX) 53, a sense amplifier (SA) 54, and a grain selector 55 (grain selection circuit). Further, WL$_0$ to WL$_{N-1}$ with N rows are connected to a row decoder 56 (also referred to as a WL decoder) and a WL driver 57 (also referred to as a word line driving circuit). Each grain 25 comprises n memory cells 1. In each word line, m grains 25 are placed.

(Operation in Sub-array Configuration in Case of Consecutive Access)

The operation of consecutive access in such a sub-array configuration mentioned above will be explained below.

Figure 16:
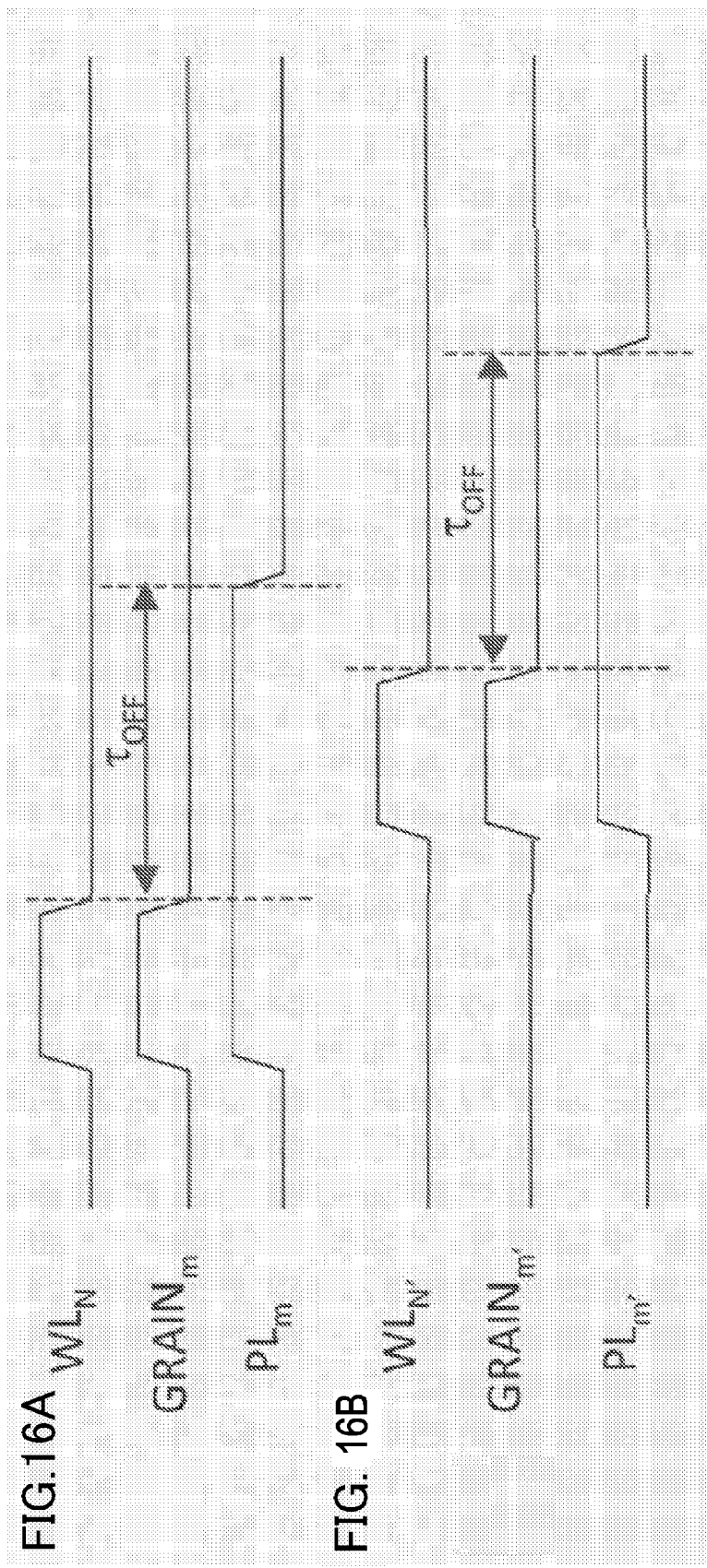

FIG. 16 illustrates a timing chart of a case in which a plurality of independent grains 25 (grain m and grain m') are consecutively selected. As illustrated in FIG. 16A, a PL/SL driver 27 selected by WL$_N$ and GRAIN$_m$ is activated. Thus, the PL/SL driver 27 sets PL$_m$ at a high level. The PL/SL driver 27 maintains PL$_m$ at a high level during a time of $\tau_{OFF}$ after fall of WL$_N$ and GRAIN$_m$. In such a manner, the grain m connected to PL$_m$ is activated. In FIG. 16B, a PL/SL driver 27 selected by WL$_{N'}$ and GRAIN$_{m'}$ is also similarly activated. The PL/SL driver 27 maintains PL$_{m'}$ at a high level during a time of $\tau_{OFF}$ after fall of WL$_{N'}$ and GRAIN$_{m'}$. In such a manner, the grain m' connected to PL$_{m'}$ is activated.

The case of the consecutive access to the plural independent grains 25 in a high-speed cycle is explained above. Since the write time of a cell in each grain 25 is ensured as $\tau_{OFF}$, writing on the cell in each grain 25 is correctly executed.

Figure 17:
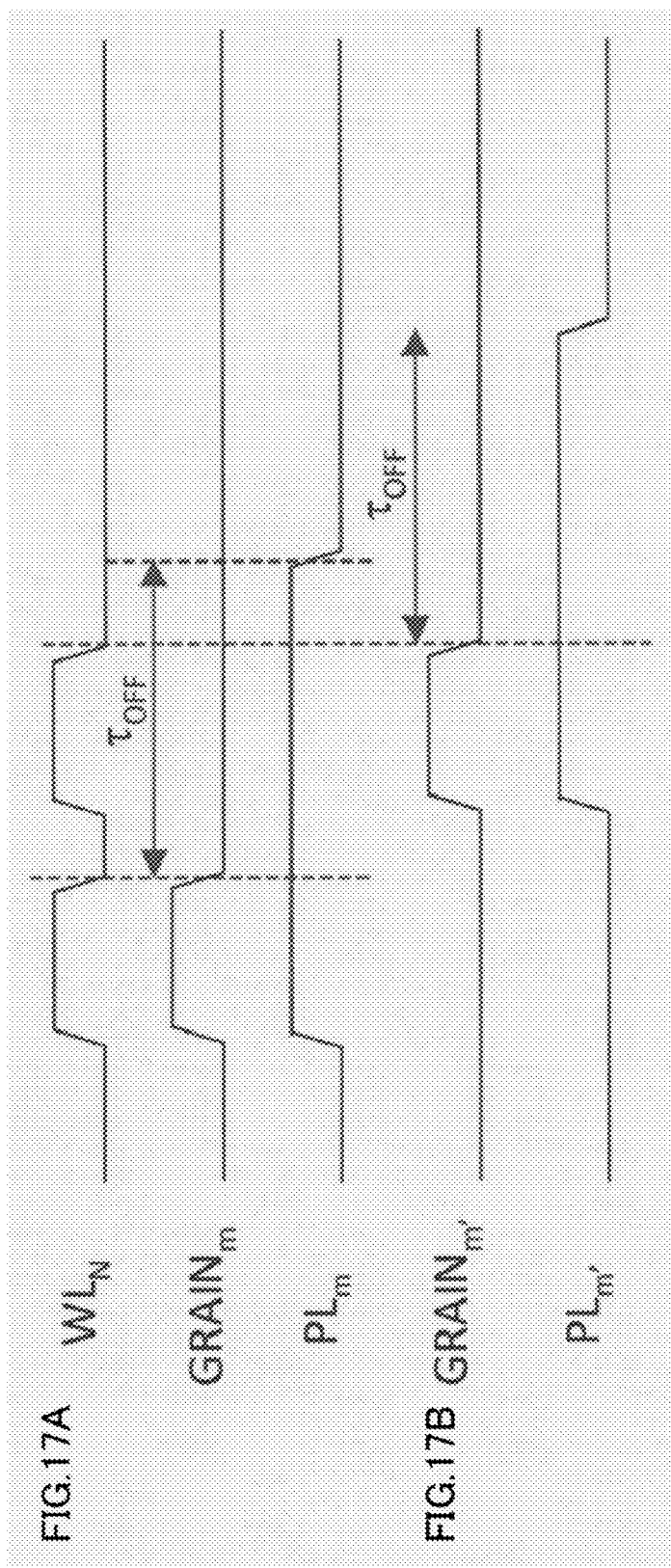

FIG. 17 is a timing chart of the case of consecutive access to a plurality of grains 25 connected to identical WL.

As illustrated in 17A, a PL/SL driver 27 selected by WL$_N$ and GRAIN$_m$ is activated. Thus, the PL/SL driver 27 sets PL$_m$ at a high level. The PL/SL driver 27 maintains PL$_m$ at a high level during a time of T$_{OFF}$ after fall of WL$_N$. In such a manner, the grain m connected to PL$_m$ is activated. Then, as illustrated in FIG. 16B, another PL/SL driver 27 selected by WL$_N$ and GRAIN$_{m'}$ is activated. The PL/SL driver 27 maintains PL$_{m'}$ at a high level during a time of $\tau_{OFF}$ after fall of WL$_N$ and GRAIN$_{m'}$. In such a manner, the grain m' connected to PL$_{m'}$ is activated.

The case of the continuous, high-speed access to the grains belonging to the identical WL is explained above. Since a write time of $\tau_{OFF}$ is secured in each of the first grain m and the next accessed grain m', the writing of the cell in each grain is correctly executed. Further, PL$_m$ for the first grain is also prevented from being activated needlessly for long time.

Figure 18:
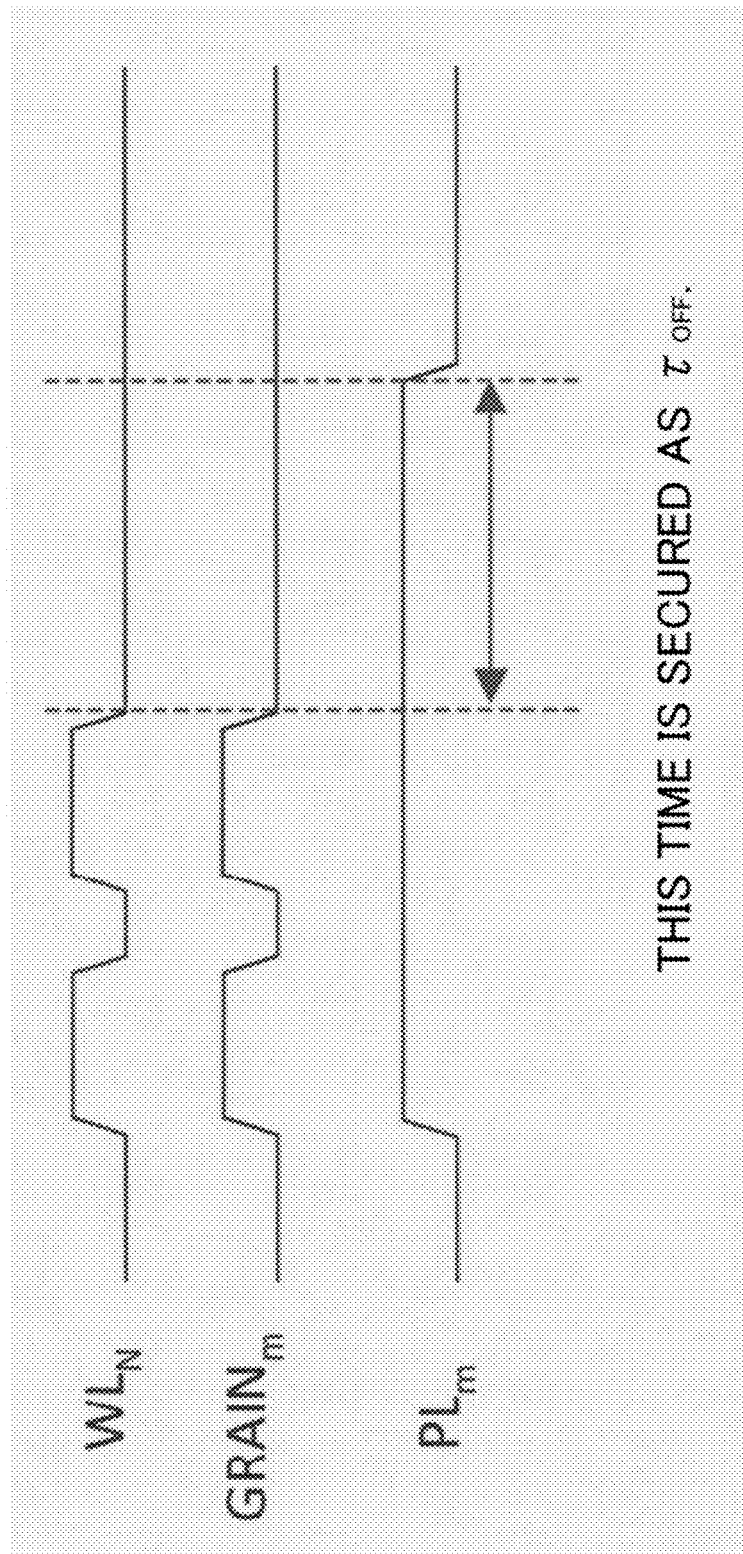
FIG. 18 is a timing chart in the case of consecutively selecting a same grain in the second embodiment.

FIG. 18 is a timing chart in the case of consecutively selecting the same grain.

When the same grain m is continuously accessed at a high speed, PL$_m$ is controlled to secure $\tau_{OFF}$ from fall of the last WL in order to ensure a write time in the last access.

In each of the cases described above, the switching of the MTJ elements 30 and 31 is safely carried out by securing $\tau_{OFF}$ on the basis of the grain 25 as a unit when high-speed writing is carried out. Further, since PL in each grain 25 is not activated for $\tau_{OFF}$ or longer, needless power is not consumed.

As illustrated in FIG. 12, PL is allowed to rise simultaneously with the rise of WL in the specific example of the first embodiment. In contrast, SL is allowed to be in a grounding state for a predetermined short period ($\tau_{ON}$) from the start of the rise of WL and PL, and then controlled to be in a floating state. During the period of $\tau_{ON}$, data stored in the MTJ elements 30 and 31 is loaded into the CMOS latch circuit (first storage circuit 2). Thus, previous data in the case in which PL is turned off can be correctly externally read out in the reading operation executed just after the rise of WL.

Then, the operation of writing on the CMOS latch circuit (first storage circuit 2) is started, PL is kept at a high level over a period of $\tau_{OFF}$ after the fall of WL to a low level even when the writing operation is finished in a high-speed cycle, and therefore, the switching of the MTJ elements 30 and 31 is slowly executed utilizing data stored in the CMOS latch circuit (first storage circuit 2).

Accordingly, a write time that is a time longer than a time for switching the MTJ elements 30 and 31 (second storage circuit 3) in the cell is secured even when the cycle of external writing on the CMOS latch circuit (first storage circuit 2) is sped up. Therefore, backup of data from the CMOS latch circuit (first storage circuit 2) into the MTJ elements 30 and 31 is carried out without any problem. In such a manner, nonvolatile storage of data is executed.

As explained above, in the storage device 20 of the present embodiment, the writing cycle of the nonvolatile storage device in which the MTJ elements 30 and 31 are used can be sped up compared to the time for switching the MTJ elements 30 and 31. In such a manner, the high-speed MTJ nonvolatile storage device can be provided.

Figure 19:
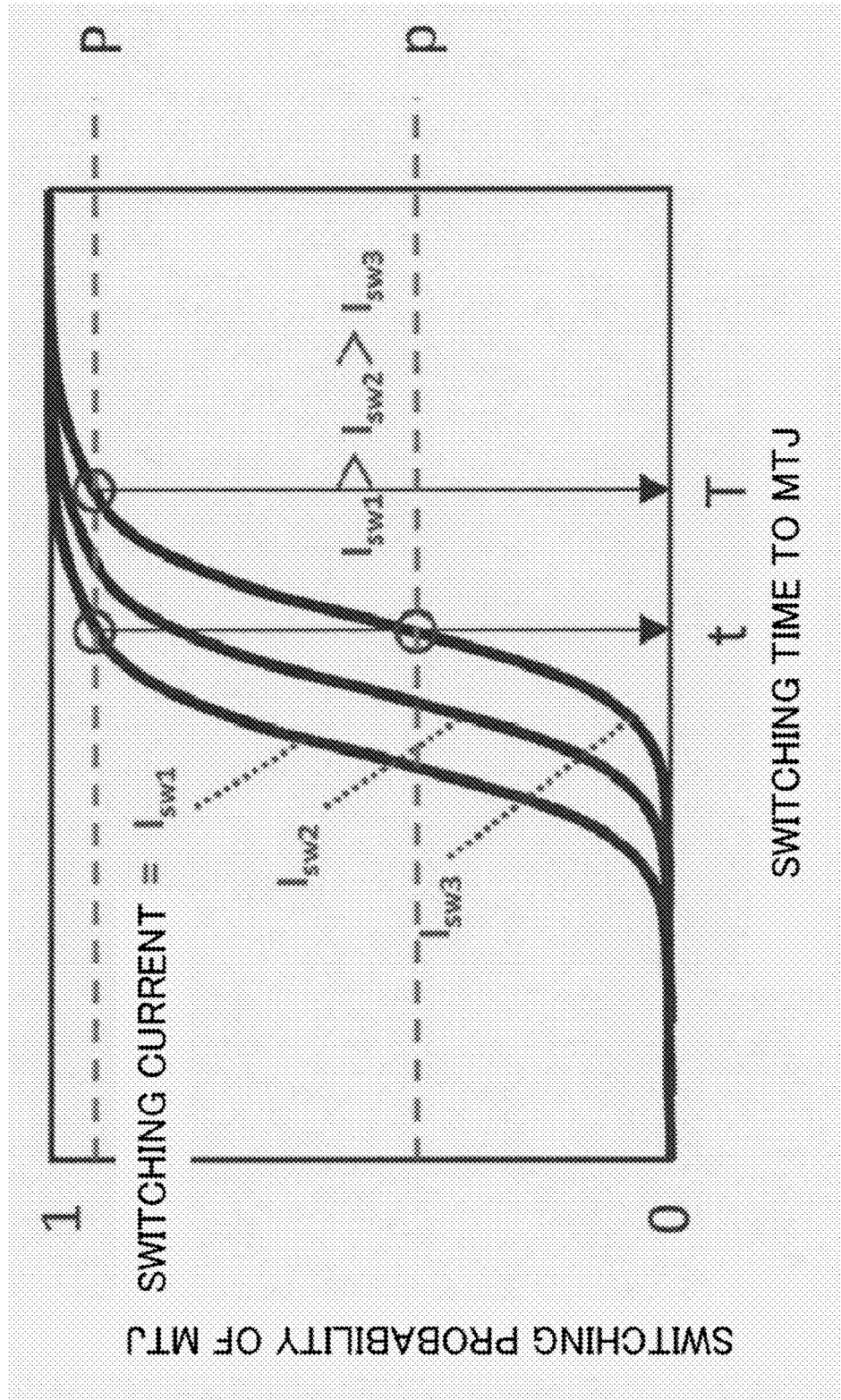
FIG. 19 is a view representing the relationship between the switching time and switching probability of MTJ elements.

FIG. 19 is a view representing the relationship between the switching time and switching probability of the MTJ elements. The horizontal axis of the figure indicates the switching time of the MTJ elements while the vertical axis indicates the switching probability of the MTJ elements. As illustrated in FIG. 19, the probability of the switching between the MTJ elements is increased with increasing the switching time when the switching between the MTJ elements is carried out at a constant current. In order to achieve a predetermined switching probability, a required switching time is increased with decreasing a switching current.

Accordingly, as the other effect of the present disclosure, the small storage device 20 capable of improving a writing probability and of stably writing data can be provided. Conventionally, a large write current (for example, $I_{SW1}$) has been needed for implementing a switching probability P necessary for productization at a write time t The switching current of MTJ depends on the transistor size of a cell. Therefore, it has been necessary to enlarge the transistor size (cell size) of the cell in order to apply a large write current. However, in the storage device 10 of the present disclosure, an external write time t is increased to an internal write time T, and therefore, data can be written at a current $I_{SW3}$ smaller than the conventionally required write current $I_{SW1}$. Thus, the cell size can be reduced.

When it is intended to design a memory with a high-speed write time t in a small cell corresponding to a current of $I_{SW3}$ assuming that the switching probability required for productization is P, the switching probability is reduced to p in the conventional art. Therefore, commercialization has been difficult. In accordance with the present disclosure, however, the switching probability can be increased to more than p and can be increased to P, and a high-speed, high-density, and non-volatile storage element can be provided.

(Third Embodiment)

As a third embodiment, another method of writing on MTJ elements 30 and 31 is explained.

Figure 20:
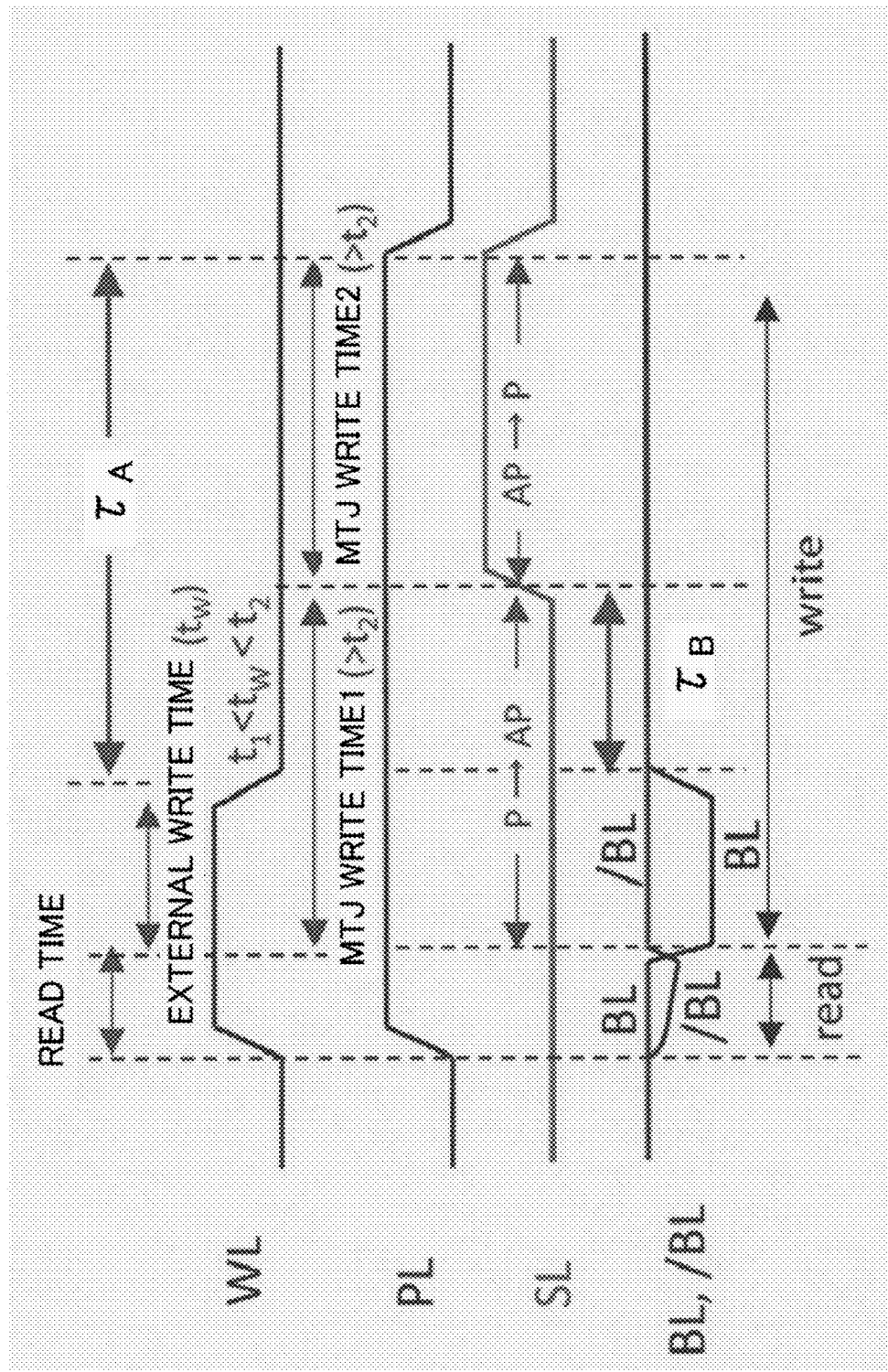
FIG. 20 is a view illustrating a timing chart of a writing method according to a third embodiment.

FIG. 20 illustrates a timing chart. The waveform of SL input into the memory cell 1 illustrated in FIG. 11 is different from the waveform illustrated in FIG. 12. The level of SL is switched during a write period in the MTJ elements, and sequential rewriting on the two MTJ elements is carried out.

It is assumed that a time necessary for writing data on one MTJ element is an MTJ write time 1 whereas a time necessary for writing data on the other MTJ element is an MTJ write time 2. In addition, both MTJ write time 1 and MTJ write time 2 are set to be longer than the switching time $t_2$ of the MTJ elements 30 and 31.

Until a lapse of a time of $\tau_B$ after fall of WL to a low level, SL is controlled to be maintained at the low level. Until the lapse of time $\tau_B$ after start of external writing, writing on one MTJ element is carried out. An MTJ write time 1 is $t_w+\tau_B$. After a lapse of a time of $\tau_B$, SL is set at a high level. During a period until a lapse of a time $\tau_A$ after fall of WL to a low level, writing on the other MTJ element is carried out. An MTJ write time 2 which is a time necessary for writing data on the other MTJ element is $\tau_A-\tau_B$. After a lapse of a time of $\tau_A-\tau_B$, SL is set at a low level.

Since SL is set at a low level in the MTJ write time 1, rewriting on the one MTJ element 30 is carried out from a parallel state to an antiparallel state (P→AP). Since SL is set at a high level in the MTJ write time 2, rewriting on the other MTJ element 31 is carried out from an antiparallel state to a parallel state (AP→P).

In such a case, $\tau_A$ and $\tau_B$ are values varying depending on the MTJ write time 1, the MTJ write time 2, and the write time $t_w$ of the CMOS latch circuit (first storage circuit).

(Parallel and Antiparallel Writing on MTJ in Grain)

A method for switching the level of SL to carry out sequential rewriting on MTJ elements 30 and 31 in twice during an MTJ writing period can also be applied to the sub-array in Embodiment 1. The configuration of the sub-array including a grain 25 is similar to that in FIG. 13. Unlike FIG. 14, a PL/SL driver 27A in the grain 25 comprises a configuration in which a delay time of $\tau_A$ and $\tau_B$ is generated.

Figure 21:
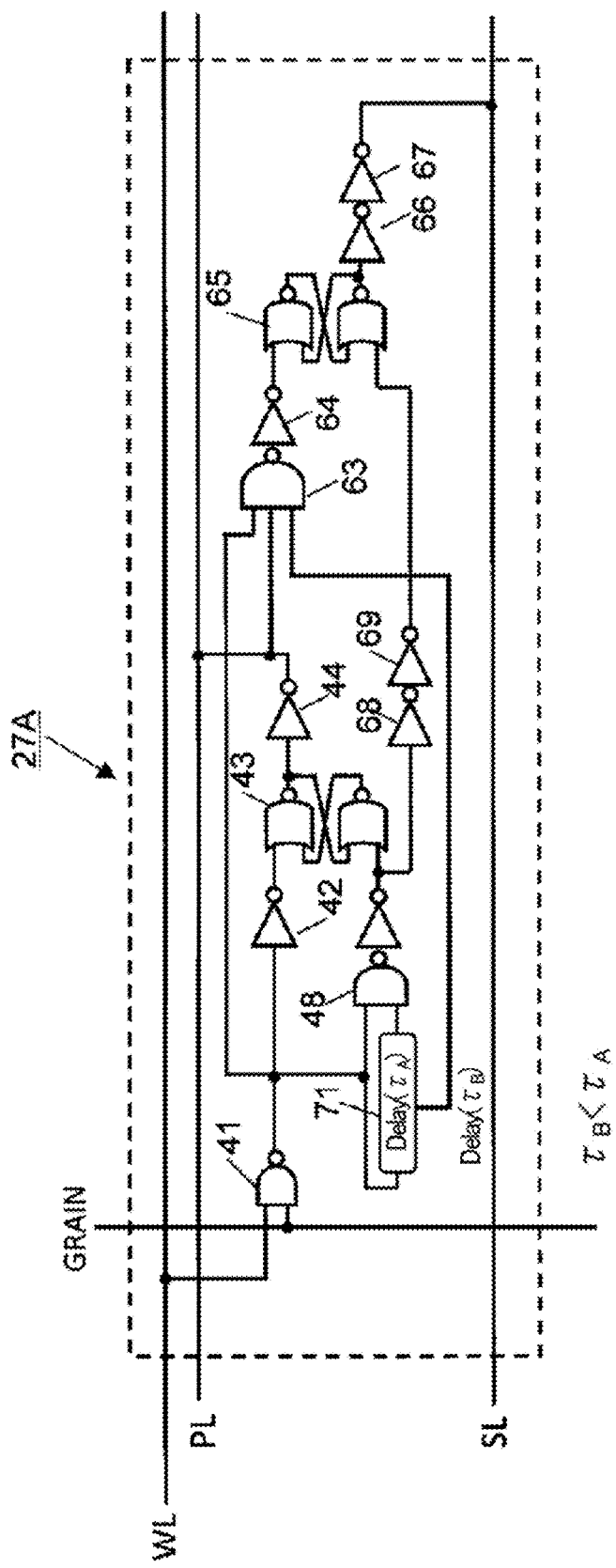
FIG. 21 is a circuit diagram of a PL/SL driver of a grain according to the third embodiment.

FIG. 21 is a circuit diagram of the PL/SL driver 27A in the grain 25. The PL/SL driver 27A comprises the circuit configuration of FIG. 14 as well as the following configuration: a three-input NAND circuit 63; a fifth inverter 64 connected to the output of the three-input NAND circuit 63; a second flip-flop 65; a sixth inverter 66 and a seventh inverter 67 connected to the second flip-flop 65; an eighth inverter 68 and a ninth inverter 69, inserted between the input of a first flip-flop 43 and the input of the second flip-flop 65; and a $\tau_A$ and $\tau_B$ delay circuit 71 connected between the output of a first two-input NAND 41 and the input of the second two-input NAND 48.

Figure 22:
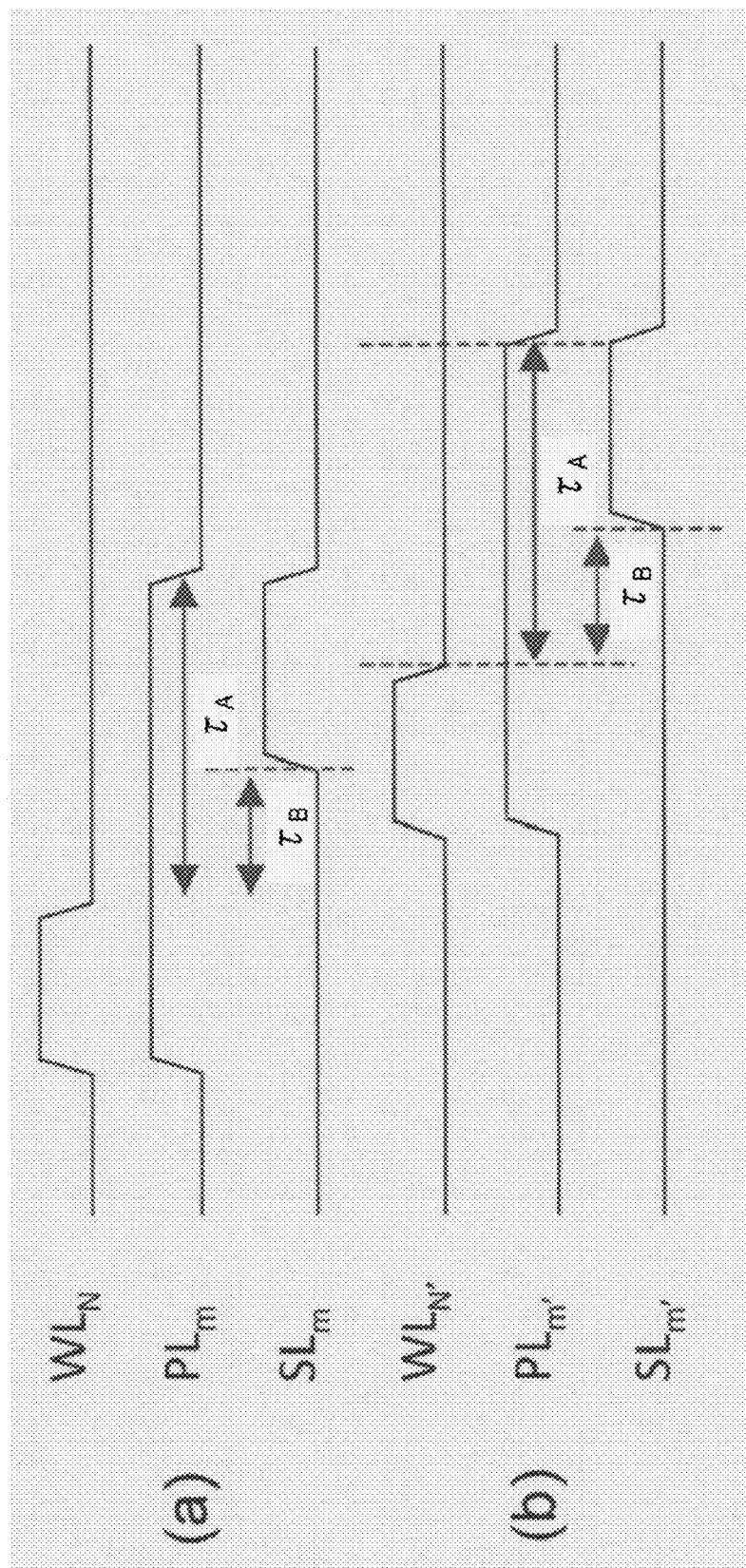

FIG. 22 illustrates a timing chart in the case of consecutively selecting a plurality of independent grains 25. Although not illustrated in FIG. 22, signals are input into $\text{GRAIN}_m$ and $\text{GRAIN}_{m'}$ at the same timings as those of $\text{WL}_N$ and $\text{WL}_{N'}$. As illustrated in FIG. 22A, a PL/SL driver 27 selected by $\text{WL}_N$ and $\text{GRAIN}_m$ is activated, and $\text{PL}_m$ is set at a high level. $\text{PL}_m$ is maintained to be at a high level during a time of $\tau_A$ after fall of $\text{WL}_N$. $\text{SL}_m$ is set at a high level after the lapse of time $\tau_B$ after the fall of $\text{WL}_N$. $\text{SL}_m$ is maintained to be at a high level during $\tau_A-\tau_B$ after the fall of $\text{WL}_N$. In such a manner, a grain m is activated by $\text{PL}_m$ and $\text{SL}_m$.

In FIG. 22B, a PL/SL driver 27 selected by $\text{WL}_{N'}$ and $\text{GRAIN}_{m'}$ is activated. $\text{PL}_{m'}$ and $\text{SL}_{m'}$ are maintained to be at a high level during a time of $\tau_A$ and a time of $\tau_A-\tau_B$ after fall of $\text{WL}_{N'}$ similarly with the case illustrated in FIG. 22A. In such a manner, a grain m' is activated by $\text{PL}_{m'}$ and $\text{SL}_{m'}$.

The case of consecutively accessing the independent, plural grains in a high-speed cycle is explained. Since the write time of a cell in each grain is ensured as $\tau_A$ ($\tau_B$ and $\tau_A-\tau_B$), writing on the cell in each grain 25 is correctly executed.

Figure 23:
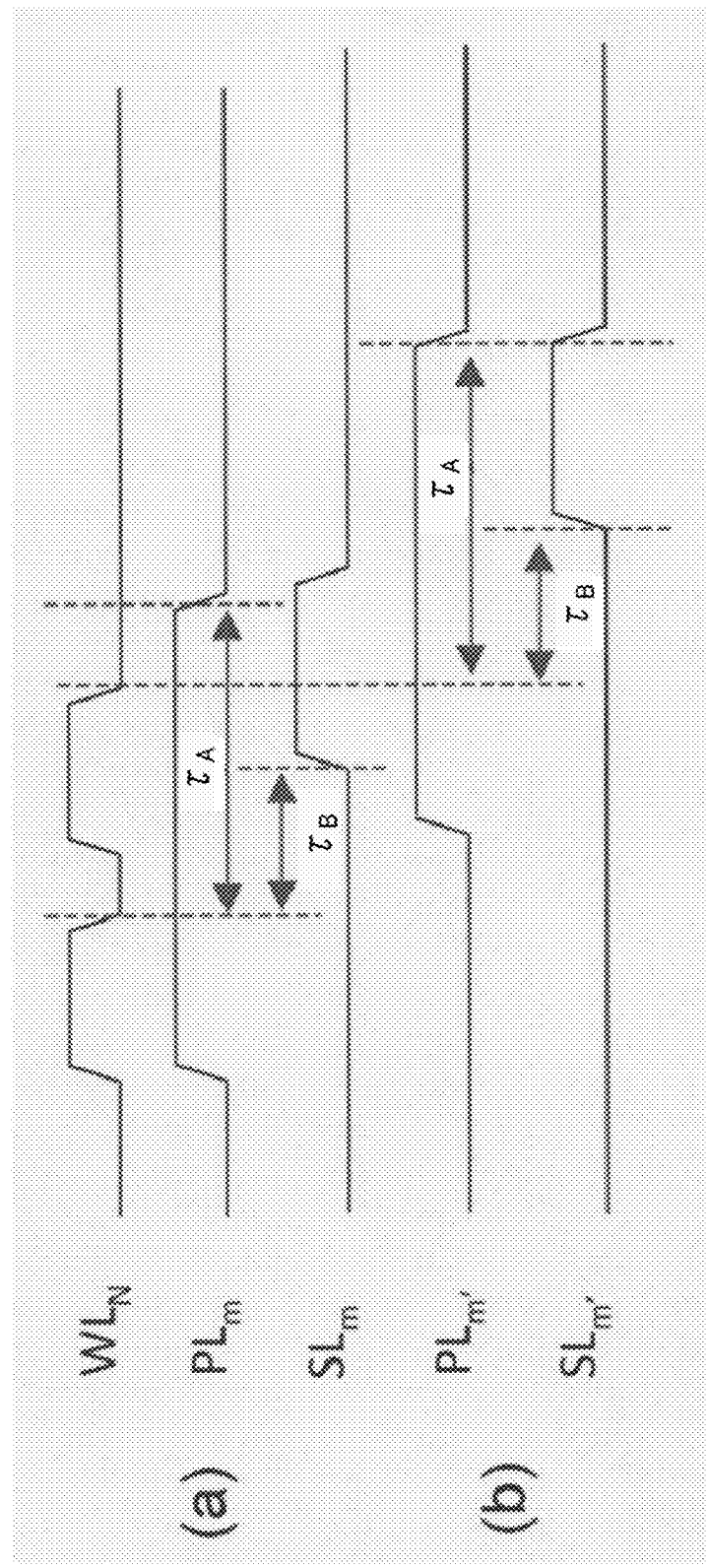

FIG. 23 is a timing chart of the case of continuously selecting a plurality of grains 25 connected to the same WL. Although not illustrated in FIG. 23, signals are input into $\text{GRAIN}_m$ and $\text{GRAIN}_{m'}$ at the same timings as those of $\text{WL}_N$ and $\text{WL}_{N'}$.

As illustrated in FIG. 23A, a PL/SL driver 27 selected by $\text{WL}_N$ and $\text{GRAIN}_m$ is activated. Thus, $\text{PL}_m$ is set at a high level. The PL/SL driver 27 maintains $\text{PL}_m$ at a high level during a time of $\tau_1$ after fall of $\text{WL}_N$. $\text{SL}_m$ is set at a high level after the elapse of a time of $\tau_B$ after the fall of $\text{WL}_N$. $\text{SL}_m$ is maintained to be at a high level during a time of $\tau_A-\tau_B$ after the fall of $\text{WL}_N$. In such a manner, a grain m is activated by $\text{PL}_m$ and $\text{SL}_m$.

Then, another PL/SL driver 27 is activated by $\text{WL}_N$ and $\text{GRAIN}_{m'}$ as illustrated in FIG. 23B. The PL/SL driver 27 maintains $\text{PL}_{m'}$ at a high level during a time of $\tau_A$ after fall of $\text{WL}_N$. In addition, the PL/SL driver 27 allows $\text{SL}_{m'}$ to be at a high level after the elapse of a time of $\tau_B$ after the fall of $\text{WL}_N$. $\text{SL}_{m'}$ is maintained to be at a high level during a time of $\tau_A-\tau_B$. In such a manner, a grain m' is activated by $\text{PL}_{m'}$ and $\text{SL}_{m'}$.

The case of continuously accessing grains belonging to the same WL at high speed is explained. Since a write time of $\tau_A$ ($\tau_B$ and $\tau_A-\tau_B$) is secured in each of the first grain m and the subsequently accessed grain m', writing on a cell in each grain is correctly executed. For example, $\text{PL}_m$ for the first grain is not activated for needlessly long time.

Figure 24:
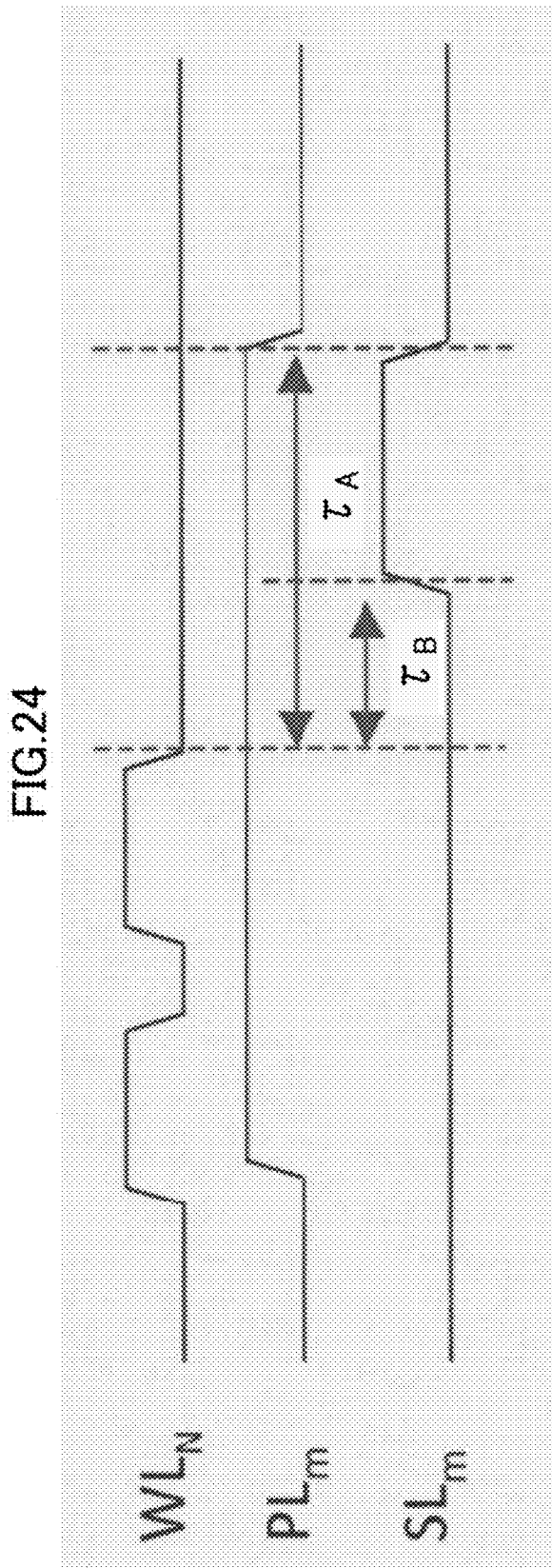
FIG. 24 is a timing chart in the case of consecutively selecting an identical grain in the third embodiment.

FIG. 24 is a timing chart of the case of consecutively selecting the identical grain 25. In such a manner, when the identical grain m is consecutively accessed at high speed, $\text{PL}_m$ is controlled to secure $\tau_B$ and $\tau_A-\tau_B$ from the final fall of WL in order to ensure a write time in the final access.

In each of FIGS. 22 to 24 described above, $\tau_A$ ($\tau_B$ and $\tau_A-\tau_B$) is secured on the basis of a grain 25 as a unit to carry out high-speed writing, and switching of MTJ is safely carried out. Further, since PL in each grain 25 is not activated for not less than WL activation time $+\tau_A$, needless power is not consumed.

As illustrated in FIG. 20, PL is allowed to rise simultaneously with the rise of WL in the third embodiment. SL is allowed to be in a grounding state (or in a floating state) over the first half of a reading period and a writing period, and WL is controlled to be at a $V_{dd}$ level after a lapse of a time of $\tau_B$ from fall of WL. Alternatively, SL may be set at a $V_{dd}$ level in the first half and may be set at a GND level in the latter half. In such a case, it is necessary to allow SL to be in a grounding state (or in a floating state) over a $\tau_{ON}$ period from rise of PL similarly with Example 1 (FIG. 12) for the purpose of correctly loading data stored in the MTJ elements 30 and 31 (second storage circuit 3) into the CMOS latch circuit (first storage circuit 2) simultaneously with the rise of PL. Thus, earlier data turned off by PL can be correctly externally read in reading operation executed just after the rise of WL.

Then, the operation of writing on the CMOS latch circuit (first storage circuit 2) is started, PL is maintained at a high level over a period of $\tau_A$ after the fall of WL to a low level even when the writing operation is finished in a high-speed cycle, and therefore, the switching of the MTJ elements 30 and 31 is slowly executed utilizing data stored in the CMOS latch circuit (first storage circuit 2).

Accordingly, a write time that is a time longer than a time for switching the MTJ elements 30 and 31 in the cell is secured even when the cycle of external writing on the CMOS latch circuit (first storage circuit 2) is sped up. Therefore, nonvolatile storage of data (backup of data from the CMOS latch circuit (first storage circuit 2) into the MTJ elements 30 and 31) is carried out without any problem.

In comparison with the first embodiment, a high voltage is applied between both terminals of the MTJ elements 30 and 31 at the time of switching of the MTJ elements 30 and 31 in the third embodiment. Therefore, the cycle of writing on the CMOS latch circuit (first storage circuit 2) is shortened. However, unnecessary time is required for the switching of two pairs of the MTJ elements 30 and 31 twice in the first half and the latter half. Of methods in the embodiments, it is impossible to categorically determine the method that makes a writing cycle shorter since the method depends on the switching characteristics of the MTJ elements 30 and 31, and a voltage.

The configuration of the memory cell 1 illustrated in FIG. 11 is described in the first embodiment, but the configuration of the memory cell is not limited thereto. The other configuration of the memory cell is described below.

(Fourth Embodiment)

Figure 25:
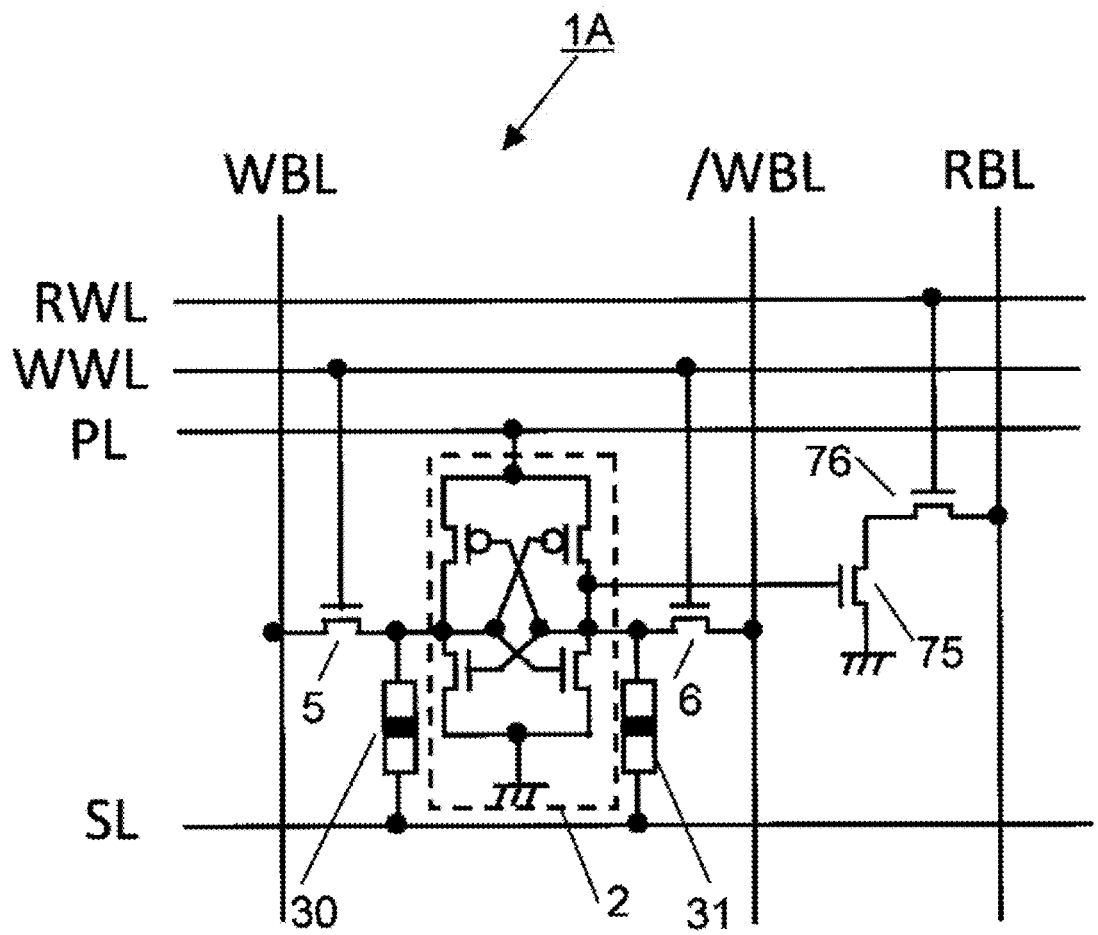
FIG. 25 is a circuit diagram illustrating an example of a memory cell used in a storage device of the present disclosure.
Figure 26:
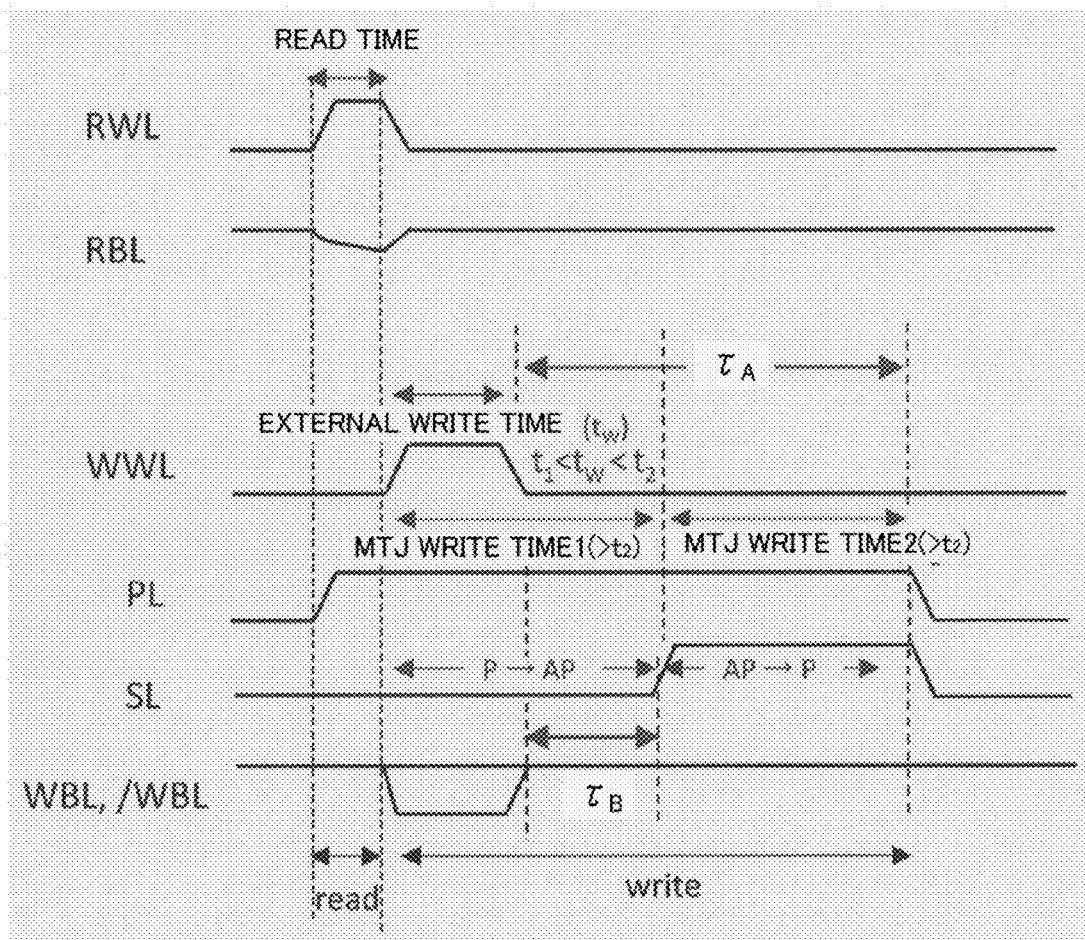
FIG. 26 is a timing chart of the storage device comprising the memory cell illustrated in FIG. 25.
Figure 27:
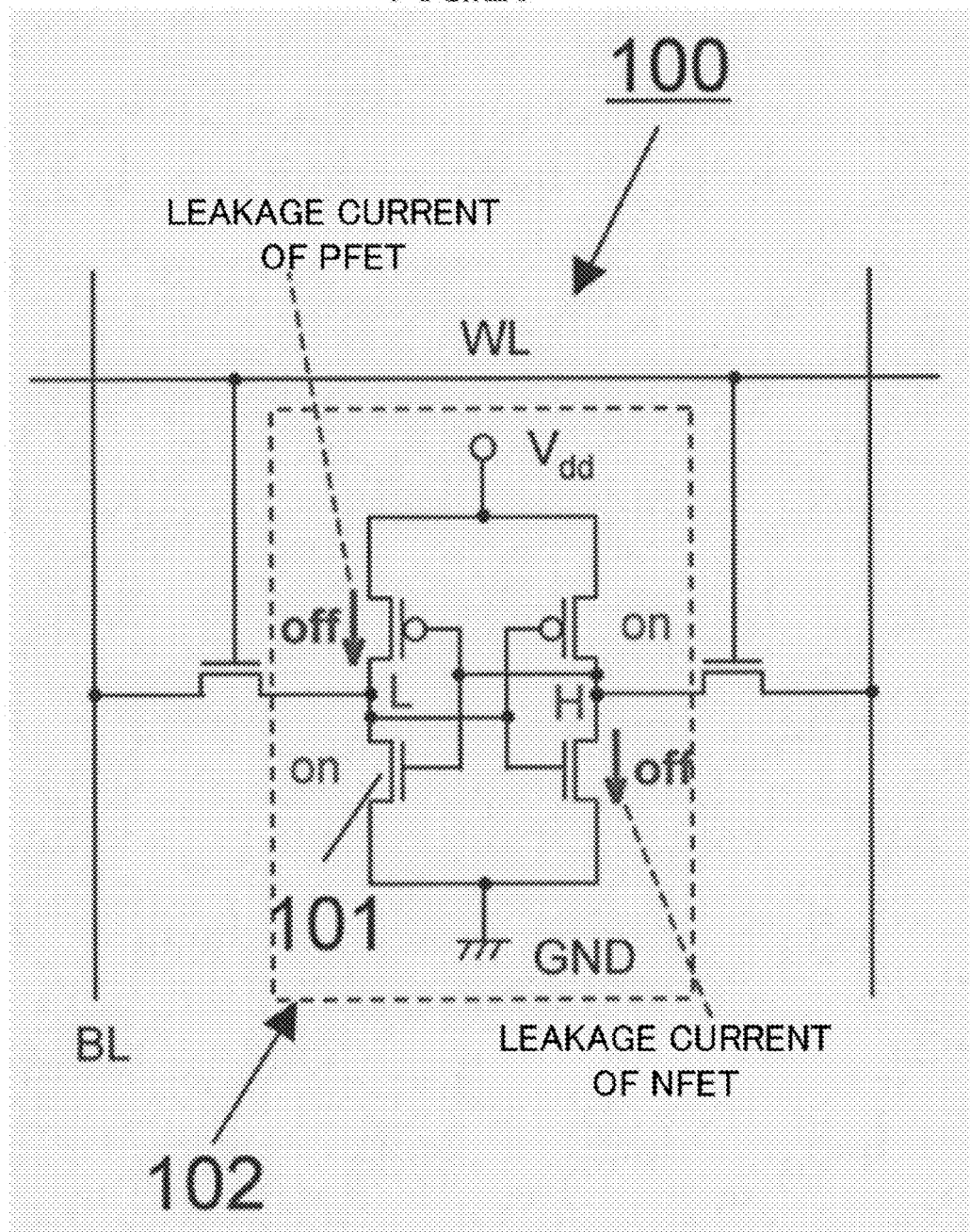
FIG. 27 is a circuit diagram of a static random access memory comprising six transistors in the related art.
Figure 28:
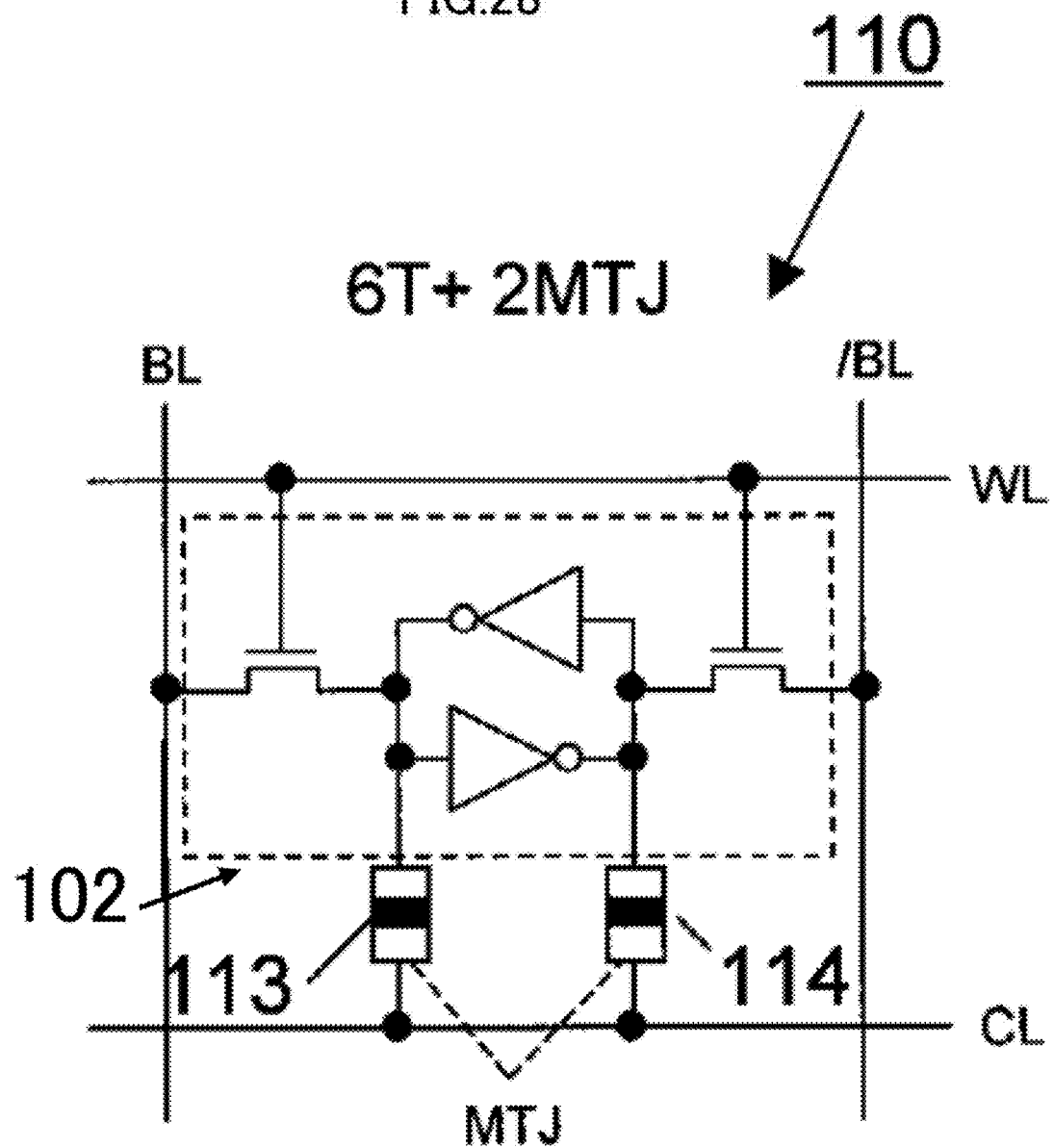
FIG. 28 is a circuit diagram of a memory cell in an SRAM in the related art.
Figure 29:
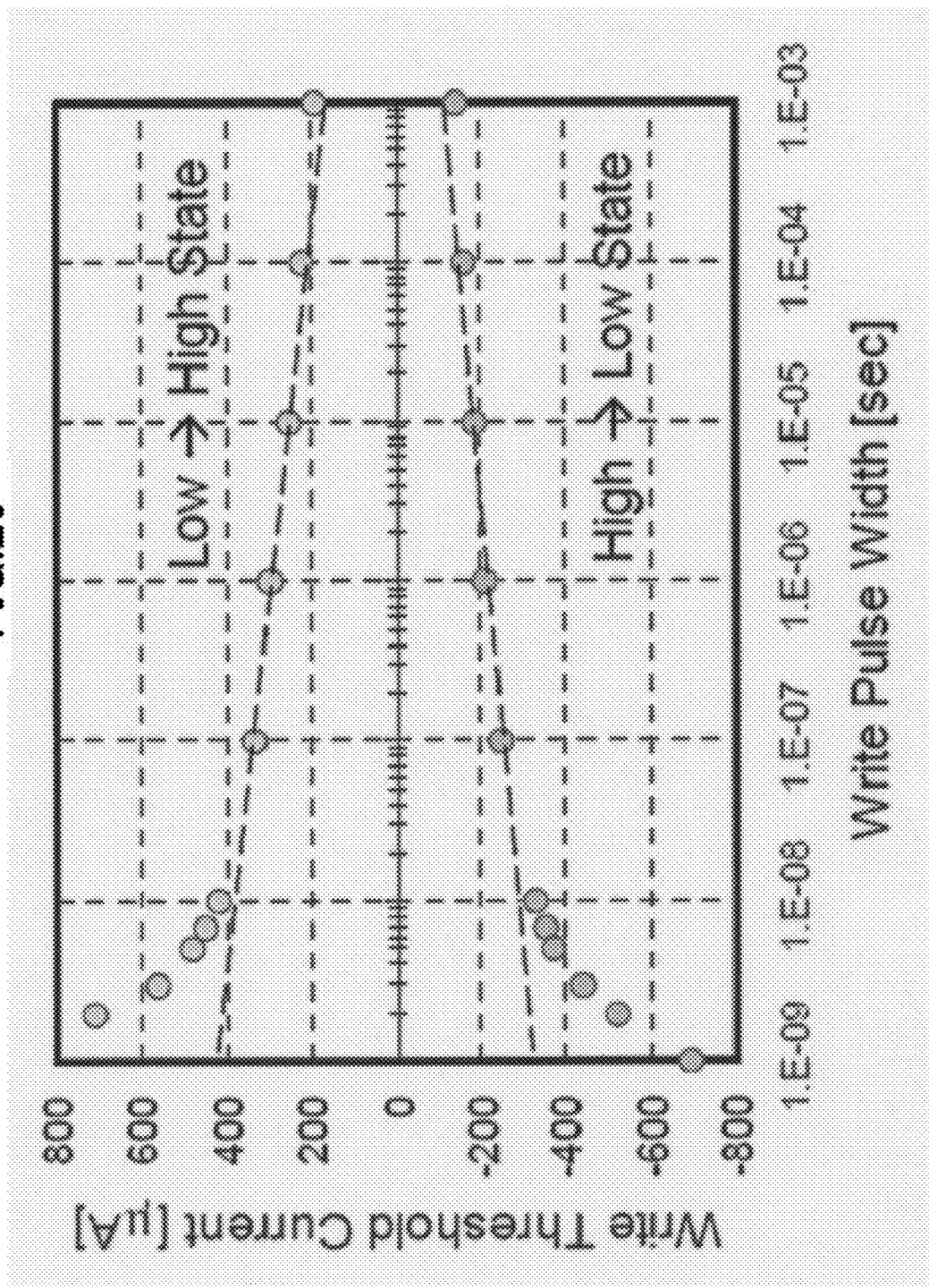
FIG. 29 is a view representing the characteristics of write threshold current caused by spin injection magnetization inversion of an MTJ element.
Figure 30:
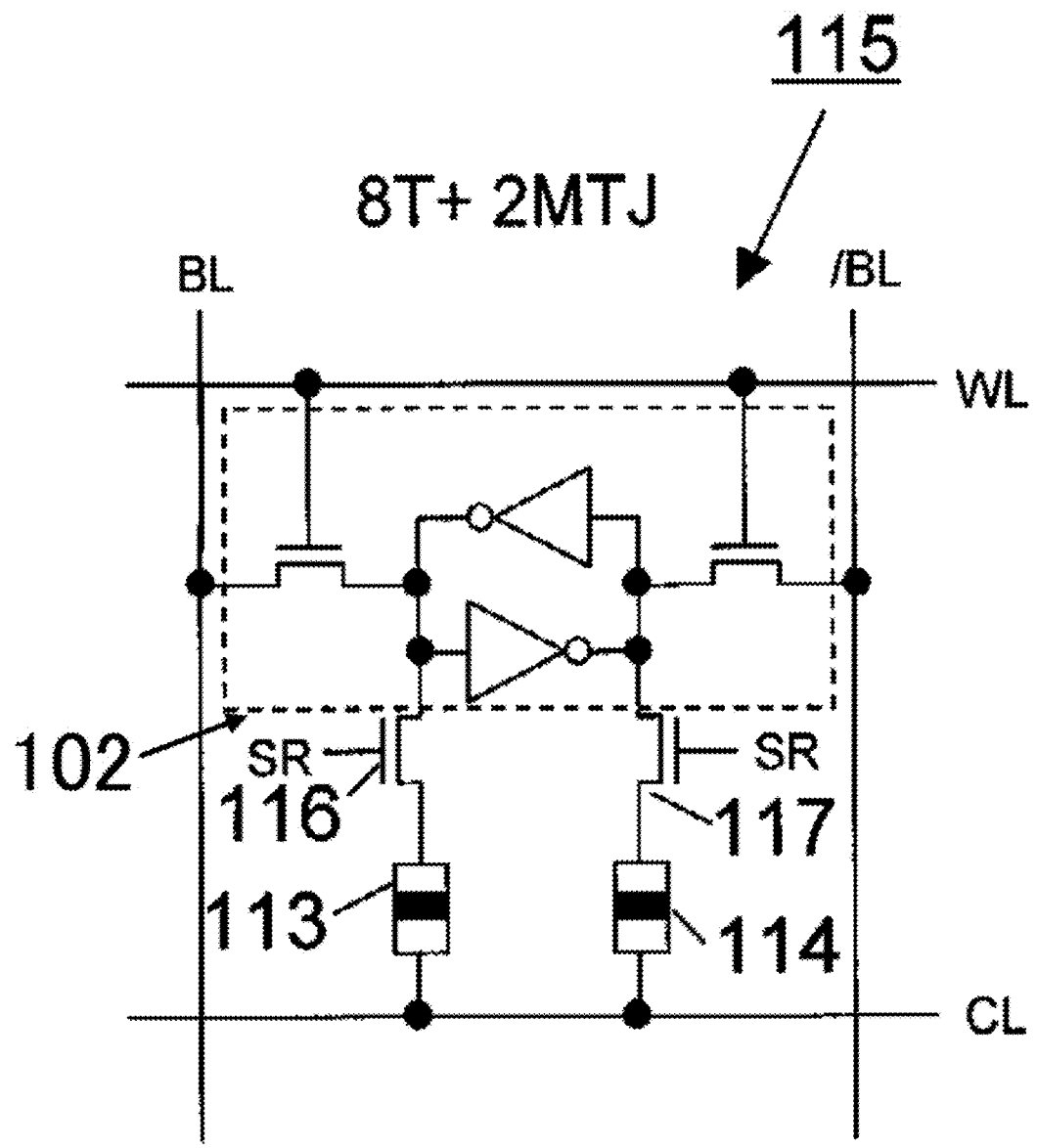
FIG. 30 is a circuit diagram of a memory cell comprising a nonvolatile storage element in the related art.
Figure 31:
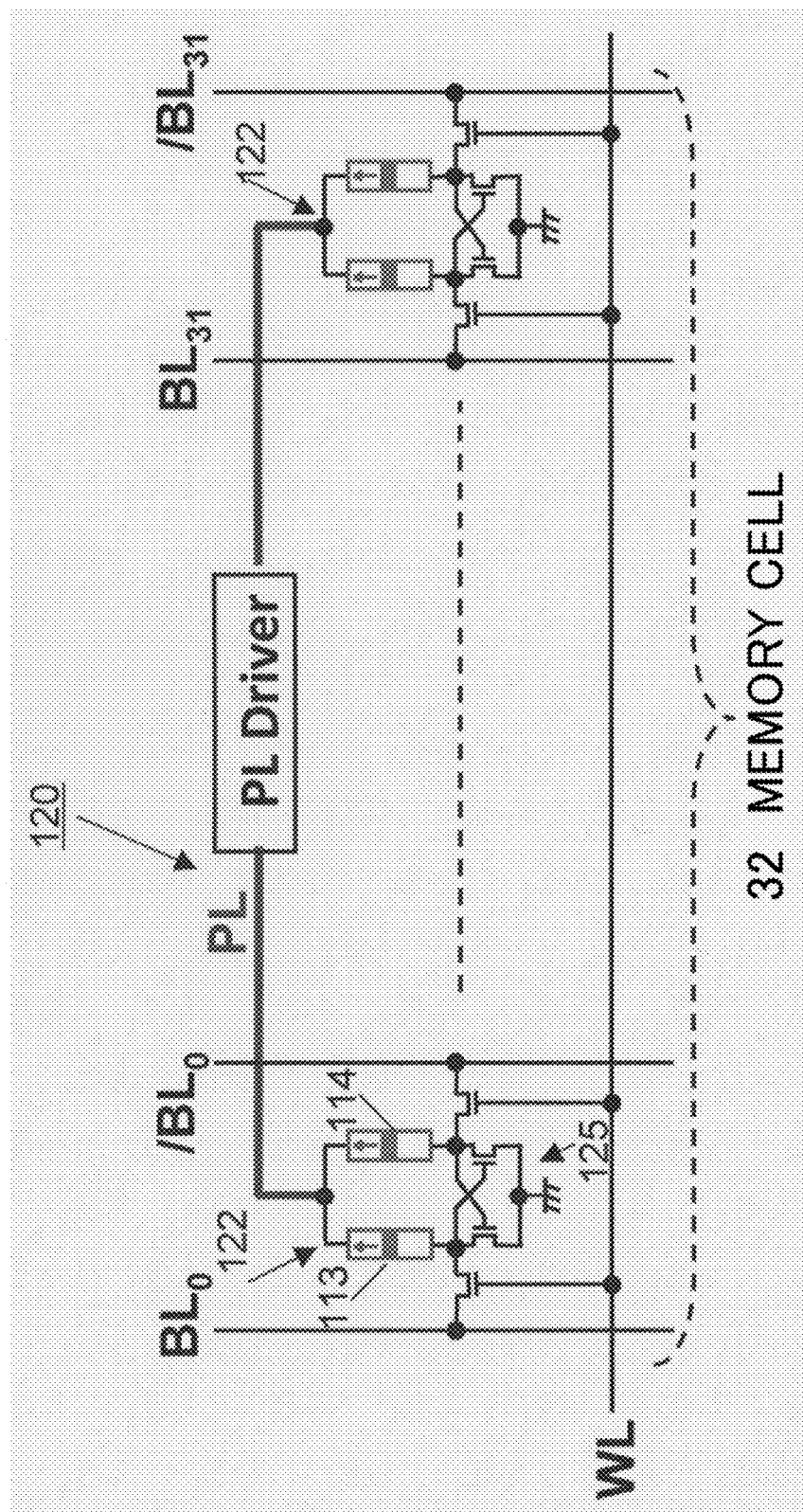
FIG. 31 is a circuit diagram of a nonvolatile memory circuit in the related art.

FIG. 25 is a circuit diagram of a memory cell 1A used in a storage device 20. FIG. 26 is a timing chart.

As illustrated in FIG. 25, the memory cell 1A used in the storage device of the present disclosure comprises the configuration of the memory cell 1 illustrated in FIG. 11 as well as RWL used exclusively for reading, RBL, and two n-type MOSFETs 75 and 76. The first and second reading n-type MOSFETs 75 and 76 are connected in series. The source of the first reading n-type MOSFET 75 is grounded. The drain of the first reading n-type MOSFET 75 and the source of the second reading n-type MOSFET 76 are connected, and the drain of the second reading n-type MOSFET 76 is connected to RBL. The gate of the first reading n-type MOSFET 75 is connected to the right data storage node of an SRAM 2. The gate of the second reading n-type MOSFET 76 is connected to RWL.

In accordance with the configuration described above, since a path used exclusively for reading is disposed in the volatile first storage circuit 2 and is separated from a writing path. Therefore, even in the case of miniaturization, writing and reading are reliably carried out, and a nonvolatile storage element is made.

As illustrated in FIG. 26, RWL is set at a high level, and data is read from the volatile first storage circuit 2. During writing on the MTJ elements 30 and 31 of the nonvolatile storage element, PL is set at a high level over a time of not less than $t_B$, the MTJ elements 30 and 31 are activated, and data is written.

(Manufacture Method)

A method for manufacturing a storage device 20 of the present disclosure will be explained below.

First, the circuit, except the MTJ elements 30 and 31, of the storage device 20 is formed on a substrate comprising a semiconductor with Si and/or the like by a CMOS process, and the spin-injection-type MTJ elements 30 and 31 are then formed.

Specifically, the formation of the spin-injection-type MTJ elements 30 and 31 is carried out as follows.

The SRAM circuit and the like are formed in the CMOS process, followed by exposing a data storage node C and a data storage node D in the SRAM circuit and on the electrodes of the data storage node C and the data storage node D by sequentially forming fixed layers 30b and 31b, tunnel barrier layers 30a and 31a, and free layers 30c and 31c, which form the MTJ elements 30 and 31. The top layers of the MTJ elements 30 and 31 are often the free layers 30c and 31c. The free layers 30c and 31c may be layers in which a plurality of ferromagnetic layers are layered. In the process, the fixed layers 30b and 31b of the MTJ elements 30 and 31 are connected to the data storage node C and the data storage node D in the storage device.

Then, an interlayer insulating layer is deposited on the whole surface of the substrate, and the free layers 30c and 31c of the MTJ elements 30 and 31, and SL are opened by photolithography and by etching of the interlayer insulating layer.

Then, a metal film having a predetermined thickness is deposited on the interlayer insulating layer by a sputtering method or the like, and the portion other than the metal film that connects the free layers 30c and 31c of the MTJ elements 30 and 31, and SL to each other is removed by selective etching. In the process, the free layers 30c and 31c of the MTJ elements 30 and 31 are connected to SL in the storage device 20. The magnetization directions of the spin-injection-type MTJ elements may be generally the direction of a plane in which the integrated circuit formed in the CMOS process is formed or may be generally a direction perpendicular to the direction of the plane in which the integrated circuit is formed.

Finally, a protective film (passivation film) is formed.

In addition to a sputtering method and a CVD method, normal thin-film formation methods such as a vapor deposition method, an MBE method, and a laser ablation method can be used for depositing each material described above. Light exposure, EB exposure, and/or the like can be used in a mask process for forming an electrode having a predetermined shape and wiring of an integrated circuit.

The MTJ elements 30 and 31 used in the storage device will be explained below.

There is an advantage that write current for the spin-injection-type MTJ elements 30 and 31 can be reduced with the miniaturization of the elements, and production on the same substrate together with the storage device comprising the CMOS integrated circuit formed on a Si substrate or the like. Further, the MTJ elements 30 and 31 can be formed in an interlayer insulating layer deposited on a data storage node in the storage device. Therefore, increase in occupation area due to the formation or connection of the MTJ elements 30 and 31 does not occur in the storage device 20. For example, the memory cell 1 illustrated in FIG. 11 comprises the SRAM comprising the six transistors and the MTJ elements 30 and 31, and the occupied area of the memory cell 1 is approximately equal to the occupied area of the SRAM.

As is apparent from the array configuration and operation explanation of the memory cell 1 and storage device 20 described above, in accordance with the storage device 20 of the present disclosure, the writing cycle of the nonvolatile second storage circuit 3 in which the MTJ elements 30 and 31 are used can be sped up compared to a time for switching the MTJs 30 and 31, depending on the size of a transistor in the cell of the volatile first storage element 2 (on which switching current depends). In other words, in accordance with the present disclosure, the high-density and high-speed MTJ nonvolatile storage device can be provided.

In the storage device 20, the MTJ elements 30 and 31 can be formed on a data storage node in a 6TSRAM, and therefore, the occupied area of one memory cell can be allowed to be approximately equal to the cell size of the 6TSRAM.

In addition, the write/read performance of the storage device 20 is equivalent to that of a 6TSARAM which is a conventional volatile memory element. Further, the storage device 20 comprises the MTJ elements 30 and 31 and therefore enables a nonvolatile storage element to be implemented. Therefore, unlike a conventional 6TSRAM, a stand-by current can be allowed to be zero.

It will be appreciated that the invention is not limited to the examples described above, and various changes may be made within the scope of the invention, described in the included claims, and are included within the scope of the invention.

In the specific examples of the first embodiment illustrated in FIG. 11 and the second embodiment illustrated in FIG. 13, it is explained that the first storage circuit 2 comprises the SRAM, and the second storage circuit 3 comprises the spin-injection-type MTJ elements. However, the first storage circuit 2 and the second storage circuit 3 may comprise a storage circuit having another configuration, or one or more storage elements. For example, the second storage circuit 3 may comprise a ReRAM, or a PCRAM or another storage element.

The present application is based on Japanese Patent Application No. 2012-288567 filed on Dec. 28, 2012. The specification, claims, and drawings of Japanese Patent Application No. 2012-288567 are incorporated herein by reference in their entirety.

INDUSTRIAL APPLICABILITY

The present disclosure can be applied to a field in which a storage device which is small and is capable of high-speed writing, and in which almost no current is dissipated during stand-by, a memory cell, and a data writing method are achieved.

REFERENCE SIGNS LIST 1, 1A: Memory cell
2: First storage circuit
3: Second storage circuit
4: PL control circuit
5: First transfer MOSFET
6: Second transfer MOSFET
7: SL control circuit
11: Read/write circuit
12: First inverter
14: Second inverter
16: First p-type MOSFET
17: First driving n-type MOSFET
18: Second p-type MOSFET
19: Second driving n-type MOSFET
20, 20A: Storage device
25: Grain
27, 27A: PL/SL driver
30, 31: MTJ element
30a, 31a: Tunnel barrier layer
30b, 31b: Fixed layer
30c, 31c: Free layer
32: Memory cell in ReRAM
32a: Lower electrode
32b: Metal oxide layer
32c: Upper electrode
33: Memory cell
33a: Lower electrode
33b: Metal oxide layer
33c: Upper electrode
34: Memory cell in PCRAM
34a: Lower electrode
34b: Chalcogenide layer
34c: Upper electrode
41: First two-input NAND
42: First inverter
43: Flip-flop
44: Second inverter
45: First delay circuit
46: Third inverter
47: N-type MOSFET
48: Second two-input NAND
49: Second delay circuit
51: Fourth inverter
53: Multiplexer
54: Sense amplifier
55: Grain selector
56: Row decoder
57: WL driver
63: Three-input NAND circuit
64: Fifth inverter
65: Second flip-flop
66: Sixth inverter
67: Seventh inverter
68: Eighth inverter
69: Ninth inverter
71: τA and τB Delay circuit
75: First reading n-type MOSFET
76: Second reading n-type MOSFET

The invention claimed is:

1. A storage device comprising:
a memory cell comprising a first storage circuit with a write time $t_1$ and a data retention time $\tau_1$ and a second storage circuit with a write time $t_2$ and a data retention time $\tau_2$ ($t_1 < t_2$ and $\tau_1 < \tau_2$);
a power control circuit for controlling power supply to the memory cell; and
a write data supply circuit for supplying write data to the memory cell,
wherein a data storage node of the first storage circuit and a data storage node of the second storage circuit are connected each other;
the write data supply circuit supplies write data to the memory cell to write the data on the first storage circuit over a write time $t_W$ that is longer than the write time $t_1$ which is a time necessary for writing data on the first storage circuit and that is shorter than the write time $t_2$ which is a time necessary for writing data on the second storage circuit, and stops the supply of the write data after the elapse of write time $t_W$; and
the power control circuit supplies power to the memory cell over a time that is longer than the write time $t_2$ of the second storage circuit when the write data is supplied from the write data supply circuit to the memory cell, writes, on the second storage circuit, the data written on the first storage circuit once the supply of the write data is stopped, and stops the supply of the power to the memory cell after a lapse of the write time $t_2$ of the second storage circuit following start of the supply of the write data.

2. The storage device according to claim 1, further comprising:
a source control circuit for controlling a power supply voltage of the second storage circuit.

3. The storage device according to claim 1, wherein the first storage circuit comprises one or more storage elements.

4. The storage device according to claim 3, wherein the first storage circuit comprises a latch in which two CMOS inverters are cross-coupled.

5. The storage device according to claim 1, wherein the second storage circuit comprises one or more storage elements.

6. The storage device according to claim 5, wherein the second storage circuit comprises two switching elements, and switching of the two switching elements is executed by connecting the two switching elements in series and by passing common current.

7. The storage device according to claim 5, wherein the second storage circuit comprises a resistance-change-type storage element.

8. The storage device according to claim 7, wherein the second storage circuit comprises a spin-injection-type MTJ element.

9. The storage device according to claim 8, wherein a magnetization direction of the spin-injection-type MTJ element is generally a direction of a plane in which an integrated circuit is formed, or generally a direction perpendicular to the direction of the plane in which the integrated circuit is formed.

10. The storage device according to claim 5, wherein the second storage circuit comprises a phase-change-type storage element.

11. A memory cell included in a storage device comprising: a memory cell comprising a first storage circuit with a write time $t_1$ and a data retention time $\tau_1$ and a second storage circuit with a write time $t_2$ and a data retention time $\tau_2$ ($t_1 < t_2$ and $\tau_1 < \tau_2$), wherein a data storage node of the first storage circuit and a data storage node of the second storage circuit are connected each other; a power control circuit for controlling supply of power to the memory cell; and a write data supply circuit for supplying write data to the memory cell, wherein the write data supply circuit supplies write data to the memory cell to write the data on the first storage circuit over a write time $t_W$ that is longer than the write time $t_1$ which is a time necessary for writing data on the first storage circuit and that is shorter than the write time $t_2$ which is a time necessary for writing data on the second storage circuit, and stops the supply of the write data at conclusion of the elapsed write time $t_W$; and the power control circuit supplies power to the memory cell over a time that is longer than the write time $t_2$ of the second storage circuit when the write data is supplied from the write data supply circuit to the memory cell, writes, on the second storage circuit, the data written on the first storage circuit once the supply of the write data is stopped, and stops the supply of the power to the memory cell after a lapse of the write time $t_2$ of the second storage circuit following start of the supply of the write data.

12. The memory cell according to claim 11, wherein the second storage circuit comprises two switching elements, and switching of the two switching elements is executed by connecting the two switching elements in series and by passing common current.

13. A data writing method comprising writing data on a plurality of memory cells comprising a first storage circuit with a write time $t_1$ and a data retention time $\tau_1$ and a second storage circuit with a write time $t_2$ and a data retention time $\tau_2$ ($t_1 < t_2$ and $\tau_1 < \tau_2$), wherein a memory cell targeted for writing is selected to start supplying power to the memory cell;

concurrently, data is written on the first storage circuit and the second storage circuit in parallel over a write time $t_W$ that is longer than the write time $t_1$ which is a time necessary for writing data on the first storage circuit and that is shorter than the write time $t_2$ which is a time necessary for writing data on the second storage circuit; and the selection of the memory cell is finished after the elapse of time $t_W$ following start of the writing of the data, the data written on the first storage circuit is written on the second storage circuit, and the supply of the power to the memory cell is stopped after a lapse of the write time $t_2$ of the second storage circuit following the start of the supply of the write data.

14. The storage device according to claim 6, wherein the second storage circuit comprises a resistance-change-type storage element.

15. The storage device according to claim 14, wherein the second storage circuit comprises a spin-injection-type MTJ element.

* * * * *